United States Patent
Varghese

(10) Patent No.: US 8,586,859 B2
(45) Date of Patent: Nov. 19, 2013

(54) WAFER LEVEL INTERCONNECTION OF INVERTED METAMORPHIC MULTIJUNCTION SOLAR CELLS

(75) Inventor: Tansen Varghese, Regensburg (DE)

(73) Assignee: Emcore Solar Power, Inc., Albuquerque, NM (US)

( * ) Notice: Subject to any disclaimer, the term of this patent is extended or adjusted under 35 U.S.C. 154(b) by 0 days.

(21) Appl. No.: 13/560,663

(22) Filed: Jul. 27, 2012

(65) Prior Publication Data

US 2013/0014803 A1 Jan. 17, 2013

Related U.S. Application Data

(62) Division of application No. 12/187,477, filed on Aug. 7, 2008, now Pat. No. 8,263,853.

(51) Int. Cl.
*H01L 31/042* (2006.01)

(52) U.S. Cl.
USPC ........... 136/249; 136/255; 136/256; 136/261; 136/262; 438/37; 438/57; 438/96; 438/98; 438/705; 438/718; 438/745; 438/752; 438/753; 257/53; 257/184; 257/190; 257/191; 257/200; 257/201

(58) Field of Classification Search
USPC ........... 136/249, 255, 256, 261, 262; 438/37, 438/57, 96, 98, 705, 718, 745, 752, 753; 257/53, 184, 190, 191, 200, 201
See application file for complete search history.

(56) References Cited

U.S. PATENT DOCUMENTS

| | | | |
|---|---|---|---|
| 3,488,834 A | 1/1970 | Baird |
| 3,964,155 A | 6/1976 | Leinkram et al. |
| 4,001,864 A | 1/1977 | Gibbons |
| 4,255,211 A | 3/1981 | Fraas |
| 4,338,480 A | 7/1982 | Antypas et al. |
| 4,393,576 A | 7/1983 | Dahlberg |
| 4,612,408 A | 9/1986 | Moddel et al. |
| 4,881,979 A | 11/1989 | Lewis |
| 5,019,177 A | 5/1991 | Wanlass |
| 5,021,360 A | 6/1991 | Melman et al. |
| 5,053,083 A | 10/1991 | Sinton et al. |
| 5,217,539 A | 6/1993 | Fraas et al. |
| 5,322,572 A | 6/1994 | Wanlass |
| 5,342,453 A | 8/1994 | Olson |

(Continued)

FOREIGN PATENT DOCUMENTS

| | | |
|---|---|---|
| EP | 1 109 230 | 6/2001 |
| EP | 1 863 099 | 12/2007 |

(Continued)

OTHER PUBLICATIONS

U.S. Appl. No. 12/265,113, filed Nov. 5, 2008, Varghese.

(Continued)

*Primary Examiner* — Golam Mowla

(57) ABSTRACT

A method of forming a plurality of discrete, interconnected solar cells mounted on a carrier by providing a first semiconductor substrate; depositing on the first substrate a sequence of layers of semiconductor material forming a solar cell structure; forming a metal back contact layer over the solar cell structure; mounting a carrier on top of the metal back contact; removing the first substrate; and lithographically patterning and etching the solar cell structure to form a plurality of discrete solar cells mounted on the carrier.

19 Claims, 26 Drawing Sheets

(56) References Cited

U.S. PATENT DOCUMENTS

| | | |
|---|---|---|
| 5,376,185 A | 12/1994 | Wanlass |
| 5,479,032 A | 12/1995 | Forrest et al. |
| 5,510,272 A | 4/1996 | Morikawa et al. |
| 5,944,913 A | 8/1999 | Hou et al. |
| 6,165,873 A | 12/2000 | Hamada |
| 6,180,432 B1 | 1/2001 | Freeouf |
| 6,218,606 B1 | 4/2001 | Morizane et al. |
| 6,239,354 B1 | 5/2001 | Wanlass |
| 6,252,287 B1 | 6/2001 | Kurtz et al. |
| 6,281,426 B1 | 8/2001 | Olson et al. |
| 6,300,557 B1 | 10/2001 | Wanlass |
| 6,300,558 B1 | 10/2001 | Takamoto et al. |
| 6,340,788 B1 | 1/2002 | King et al. |
| 6,388,187 B1 | 5/2002 | Takeyama et al. |
| 6,482,672 B1 | 11/2002 | Hoffman et al. |
| 6,660,928 B1 | 12/2003 | Patton et al. |
| 6,690,041 B2 | 2/2004 | Armstrong et al. |
| 6,794,631 B2 | 9/2004 | Clark |
| 6,815,736 B2 | 11/2004 | Mascarenhas |
| 6,951,819 B2 | 10/2005 | Iles et al. |
| 7,071,407 B2 | 7/2006 | Faterni et al. |
| 7,122,734 B2 | 10/2006 | Fetzer et al. |
| 7,166,520 B1 | 1/2007 | Henley |
| 7,727,795 B2 | 6/2010 | Stan et al. |
| 7,741,146 B2 | 6/2010 | Cornfeld et al. |
| 7,785,989 B2 | 8/2010 | Sharps et al. |
| 7,812,249 B2 | 10/2010 | King et al. |
| 7,842,881 B2 | 11/2010 | Comfeld et al. |
| 7,846,759 B2 | 12/2010 | Atwater, Jr. et al. |
| 7,960,201 B2 | 6/2011 | Cornfeld et al. |
| 7,988,875 B2 | 8/2011 | Choi et al. |
| 8,039,291 B2 | 10/2011 | Cornfeld et al. |
| 8,067,687 B2 | 11/2011 | Wanlass |
| 8,187,907 B1 | 5/2012 | Newman |
| 8,227,689 B2 | 7/2012 | King et al. |
| 8,236,600 B2 | 8/2012 | Cornfeld |
| 8,263,853 B2 | 9/2012 | Varghese |
| 8,263,856 B2 | 9/2012 | Cornfeld et al. |
| 2005/0211291 A1 | 9/2005 | Bianchi |
| 2006/0021565 A1 | 2/2006 | Zahler et al. |
| 2006/0162768 A1 | 7/2006 | Wanlass et al. |
| 2006/0185582 A1 | 8/2006 | Atwater, Jr. et al. |
| 2007/0137694 A1 | 6/2007 | Foster et al. |
| 2007/0218649 A1 | 9/2007 | Hernandez |
| 2007/0277873 A1 | 12/2007 | Cornfeld et al. |
| 2008/0029151 A1 | 2/2008 | McGlynn et al. |
| 2008/0149173 A1* | 6/2008 | Sharps, Jr. ............ 136/255 |
| 2008/0185038 A1 | 8/2008 | Sharps |
| 2008/0190886 A1 | 8/2008 | Choi et al. |
| 2008/0245409 A1 | 10/2008 | Varghese et al. |
| 2009/0038679 A1 | 2/2009 | Varghese et al. |
| 2009/0078308 A1* | 3/2009 | Varghese et al. ........ 136/255 |
| 2009/0078309 A1 | 3/2009 | Cornfeld et al. |
| 2009/0078310 A1 | 3/2009 | Stan et al. |
| 2009/0078311 A1* | 3/2009 | Stan et al. ............ 136/255 |
| 2009/0155952 A1 | 6/2009 | Stan et al. |
| 2009/0188546 A1 | 7/2009 | McGlynn et al. |
| 2009/0223554 A1 | 9/2009 | Sharps |
| 2009/0229658 A1 | 9/2009 | Stan et al. |
| 2009/0229662 A1 | 9/2009 | Stan et al. |
| 2009/0272430 A1 | 11/2009 | Cornfeld et al. |
| 2009/0272438 A1 | 11/2009 | Cornfeld |
| 2009/0288703 A1 | 11/2009 | Stan et al. |
| 2009/0314348 A1 | 12/2009 | McGlynn et al. |
| 2010/0012174 A1 | 1/2010 | Varghese et al. |
| 2010/0012175 A1 | 1/2010 | Varghese et al. |
| 2010/0047959 A1 | 2/2010 | Cornfeld et al. |
| 2010/0093127 A1 | 4/2010 | Sharps et al. |
| 2010/0122724 A1 | 5/2010 | Cornfeld et al. |
| 2010/0122764 A1 | 5/2010 | Newman |
| 2010/0147366 A1 | 6/2010 | Stan et al. |
| 2010/0186804 A1 | 7/2010 | Cornfeld |
| 2010/0203730 A1 | 8/2010 | Cornfeld et al. |
| 2010/0206365 A1 | 8/2010 | Chumney et al. |
| 2010/0229913 A1 | 9/2010 | Cornfeld |
| 2010/0229926 A1 | 9/2010 | Newman et al. |
| 2010/0229932 A1 | 9/2010 | Cornfeld et al. |
| 2010/0229933 A1 | 9/2010 | Cornfeld |
| 2010/0233838 A1 | 9/2010 | Varghese |
| 2010/0236615 A1 | 9/2010 | Sharps |
| 2010/0282288 A1 | 11/2010 | Cornfeld |
| 2011/0041898 A1 | 2/2011 | Cornfeld |

FOREIGN PATENT DOCUMENTS

| | | |
|---|---|---|
| EP | 0 658 944 | 4/2009 |
| FR | 2 878 076 A1 | 5/2006 |
| WO | WO 2005/015638 A1 | 2/2005 |

OTHER PUBLICATIONS

U.S. Appl. No. 12/708,361, filed Feb. 18, 2010, Cornfeld et al.
U.S. Appl. No. 12/716,814, filed Mar. 3, 2010, Cornfeld.
U.S. Appl. No. 12/730,018, filed Mar. 23, 2010, Cornfeld.
U.S. Appl. No. 12/756,926, filed Apr. 8, 2010, Cornfeld et al.
U.S. Appl. No. 12/813,408, filed Jun. 10, 2010, Patel et al.
U.S. Appl. No. 12/844,673, filed Jul. 27, 2010, Stan et al.
Advisory Action mailed Mar. 15, 2011 for U.S. Appl. No. 11/445,793.
Aiken et al. "Consideration of High Bandgap Subcells for Advanced Multijunction Solar Cells," Conference Record of the 2006 IEEE 4th World Conference on Photovoltaic Energy Conversion. May 1, 2006, pp. 838-841.
Cornfeld et al., "Development of a Large Area Inverted Metamorphic Multi-junction (IMM) Highly Efficient AM0 Solar Cell," 33rd IEEE Photovoltaic Specialists Conference, May 11-16, 2008, San Diego, CA, USA.
Cornfeld et al., "Development of a Large Area Inverted Metamorphic Multi-junction Highly Efficient AM0 Solar Cell," Conference paper presented at the 33rd IEEE Photovoltaic Specialists Conference (May 11-16, 2008) on May 12, 2008. San Diego, CA, USA. 17 pages.
Cornfeld et al., "Advances in the Performance of Inverted Metamorphic Multi-junction Solar Cells," 23rd European Photovoltaic Energy Conference, Sep. 1-5, 2008, Valencia, Spain.
Friedman et al., "0.7-eV GaInAs Junction for a GaInP/GaAs/GaInAs(1eV)/GaInAs(0.7eV) Four-Junction Solar Cell," 2006 IEEE 4th World Conference on Photovoltaic Energy Conversion, May 7-12, 2006, Waikoloa, Hawaii, USA.
Geisz et al., "High-efficiency GaInP/GaAs/InGaAs triple-junction solar cells grown inverted with a metamorphic bottom junction," *Applied Physics Letters*, 2007; 91(023502):023502-1-023502-3. Online publication Jul. 10, 2007. American Institute of Physics, Melville, NY, USA.
Geisz, et al., "Inverted GaInP/(In)GaAs/InGaAs Triple-Junction Solar Cells with Low-Stress Metamorphic Bottom Junctions," 33rd IEEE Photovoltaic Specialists Conference, May 11-16, 2008, San Diego, CA, USA.
King et al., "Next-Generation, High-Efficiency III-V Multijunction Solar Cells," 28th IEEE Photovoltaic Specialists Conference, Sep. 15-22, 2000, Anchorage, AK, USA.
King et al., "High-Efficiency Space and Terrestrial Multijunction Solar Cells Through Bandgap Control in Cell Structures," 2002 Photovoltaic Specialists Conference, Conference Record of the 29th IEEE, May 19-24, 2002, pp. 776-781. New Orleans, LA, USA.
Office Action mailed Jan. 4, 2011 for U.S. Appl. No. 11/445,793 (Sexl reference, double patenting rejection).
Partial European Search Report for EP 08 01 3466 dated Feb. 12, 2009.
Schultz et al., "High Efficiency 1.0 eV GaInAs Bottom Solar Cell for 3-junction Monolithic Stack," Conference Record of the Twenty First IEEE Photovoltaic Specialists Conference. Kissimmee, Florida; May 21-25, 1990. New York: The Institute of Electrical and Electronics Engineers, Inc. pp. 148-152.
Sexl et al., "MBE Growth of Metamorphic In(Ga)AIAs Buffers," 1997 IEEE International Symposium on Compound Semiconductors, Sep. 1997, pp. 49-52. IEEE, Piscataway, NJ.
Sharps et al., "Inverting the triple junction improves efficiency and flexibility," *Compound Semiconductor*, Oct. 2007, pp. 25-28. IOP Publishing, Ltd., Bristol, England.

(56) References Cited

OTHER PUBLICATIONS

Sinharoy et al., "Progress in the Development of Metamorphic Multijunction III-V Space Solar Cells," *Progress in Photovoltaics: Research and Applications*, Feb. 2002;10:427-432. John Wiley & Sons, Ltd, Hoboken, NJ, USA.

Stan et al., "Very High Efficiency Triple Junction Solar Cells by MOVPE," 14$^{th}$ International Conference of Metalorganic Vapor Phase Epitaxy. Jun. 1-6, 2008, Metz, France.

Stan, et al., "High-efficiency quadruple junction solar cells using OMVPE with inverted metamorphic device structures," *Journal of Crystal Growth*, 2010; 312:1370-1374. Elsevier, Amsterdam, Netherlands.

Takamoto, et al., "Future Development of InGaP/(In)GaAs Based Multijunction Solar Cells," Proceedings of the 31st IEEE PVSC, Jan. 3-7, 2005, Lake Buena Vista, FL; pp. 519-524.

Takamoto et al., "InGaP/GaAs-based Multijunction Solar Cells," *Progress in Photovoltaics: Research and Applications*, 2005; 13:495-511. Wiley InterScience, John Wiley & Sons, Ltd., Hoboken, NJ.

Venkatasubramanian et al., "An Inverted-Growth Approach to Development of an IR-Transparent, High Efficiency AlGaAs/GaAs Cascade Solar Cell," 22nd IEEE Photovoltaic Specialists Conference, Oct. 7-11, 1991, Las Vegas, NV, USA.

Venkatasubramanian et al., "High-quality eutectic-metal-bonded AlGaAs-GaAs thin films on Si substrates," *Applied Physics Letters*, Feb. 17, 1992; 60(7):886-888.

Wanlass et al., "Lattice-Mismatched Approaches for High-Performance, III-V Photovoltaic Energy Converters," Proceedings of the 31st IEEE PVSC, Jan. 3-7, 2005. Lake Buena Vista, FL, USA.

Wanlass et al., "Lattice-Mismatched Approaches for High-Performance, III-V Photovoltaic Energy Converters," Conference Record of the 31st IEEE PVSC, Jan. 3, 2005. Piscataway, NJ, USA.

Wanlass et al., "Monolithic, Ultra-Thin GaInP/GaAs/GaInAs Tandem Solar Cells," 2006 4$^{th}$ IEEE World Conference on Photovoltaic Energy Conversion, May 1, 2006, pp. 729-732.

Wanlass et al., "Monolithic, Ultra-Thin GaInP/GaAs/GaInAs Tandem Solar Cells," 2006 IEEE World Conference on Photovoltaic Energy Conversion, May 7-12, 2006, Waikoloa, Hawaii, USA.

Wurfel, ed., *Physics of Solar Cells: from Basic Principles to Advanced Concepts. 2nd, Updated and Expanded Edition*, Weinheim, Germany 2009. Sections 6.4, 6.5 and 6.8.; 20 pages.

Yamaguchi, "Physics and Technologies of Superhigh-Effficiency Tandem Solar Cells," *Semiconductors*, Sep. 1999; 33(9):961-964, Toyota Technological Institute, Nagoya, Japan, © 1999, American Institute of Physics.

Yoon et al., "Progress of Inverted Metamorphic III-V Solar Cell Development at Spectrolab," 33rd IEEE Photovoltaic Specialists Conference, May 11-16, 2008, San Diego, CA, USA.

* cited by examiner

WAFER LEVEL INTERCONNECTION OF INVERTED METAMORPHIC MULTIJUNCTION SOLAR CELLS

This application is a divisional of application Ser. No. 12/187,477, filed Aug. 7, 2008, which is incorporated herein by reference in its entirety.

REFERENCE TO RELATED APPLICATIONS

This application is related to co-pending U.S. patent application Ser. No. 12/218,582 filed Jul. 16, 2008.

This application is related to co-pending U.S. patent application Ser. No. 12/218,558 filed Jul. 16, 2008.

This application is related to co-pending U.S. patent application Ser. No. 12/123,864 filed May 20, 2008.

This application is related to co-pending U.S. patent application Ser. No. 12/102,550 filed Apr. 14, 2008.

This application is related to co-pending U.S. patent application Ser. No. 12/047,842, and U.S. Ser. No. 12/047,944, filed Mar. 13, 2008.

This application is related to co-pending U.S. patent application Ser. No. 12/023,772, filed Jan. 31, 2008.

This application is related to co-pending U.S. patent application Ser. No. 11/956,069, filed Dec. 13, 2007.

This application is also related to co-pending U.S. patent application Ser. Nos. 11/860,142 and 11/860,183 filed Sep. 24, 2007.

This application is also related to co-pending U.S. patent application Ser. No. 11/836,402 filed Aug. 9, 2007.

This application is also related to co-pending U.S. patent application Ser. No. 11/616,596 filed Dec. 27, 2006.

This application is also related to co-pending U.S. patent application Ser. No. 11/614,332 filed Dec. 21, 2006.

This application is also related to co-pending U.S. patent application Ser. No. 11/445,793 filed Jun. 2, 2006.

This application is also related to co-pending U.S. patent application Ser. No. 11/500,053 filed Aug. 7, 2006.

GOVERNMENT RIGHTS STATEMENT

This invention was made with government support under Contract No. FA9453-04-2-0041 awarded by the U.S. Air Force. The Government has certain rights in the invention.

BACKGROUND OF THE INVENTION

1. Field of the Invention

The present invention relates to the field of solar cell semiconductor devices, and to multijunction solar cells based on III-V semiconductor compounds including a metamorphic layer. More particularly, the invention relates to the interconnection of discrete solar cells such as in an array or matrix of cells mounted on an integral carrier, and in particular to fabrication processes associated with inverted metamorphic multijunction solar cells.

2. Description of the Related Art

Photovoltaic cells, also called solar cells, are one of the most important new energy sources that have become available in the past several years. Considerable effort has gone into solar cell development. As a result, solar cells are currently being used in a number of commercial and consumer-oriented applications. While significant progress has been made in this area, the requirement for solar cells to meet the needs of more sophisticated applications has not kept pace with demand. Applications such as concentrator terrestrial power systems and satellites used in data communications have dramatically increased the demand for solar cells with improved power and energy conversion characteristics.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as the payloads become more sophisticated, solar cells, which act as the power conversion devices for the on-board power systems, become increasingly more important.

Inverted metamorphic solar cell structures such as described in M. W. Wanlass et al., Lattice Mismatched Approaches for High Performance, III-V Photovoltaic Energy Converters (Conference Proceedings of the 31$^{st}$ IEEE Photovoltaic Specialists Conference, Jan. 3-7, 2005, IEEE Press, 2005) present an important conceptual starting point for the development of future commercial high efficiency solar cells. The structures described in such reference present a number of practical difficulties relating to the appropriate choice of materials and fabrication steps, for a number of different layers of the cell.

Solar cells are often fabricated in vertical, multijunction structures, and the individual cells or die are disposed in horizontal arrays, with the individual solar cells connected together in a series. The shape and structure of an array, as well as the number of cells it contains, are determined in part by the desired output voltage and current.

Usually, arrays of solar cells are assembled from individual solar cells. The individual solar cells are fabricated on a wafer, diced up, and then the individual die are bonded onto a platform, for example on a ceramic receiver substrate, and the individual receivers interconnected after this operation. Such interconnection techniques present issues of assembly costs, yield losses, and possibly less than ideal packing density.

SUMMARY OF THE INVENTION

Briefly, and in general terms, the present invention provides a method of forming a plurality of solar cells mounted on a carrier by providing a first semiconductor substrate; depositing on the first substrate a sequence of layers of semiconductor material forming a solar cell structure; forming a metal back contact layer over the solar cell structure; mounting a carrier on top of the metal back contact; lithographically patterning and etching said solar cell structure to form a plurality of discrete solar cells mounted on the carrier; and removing the first substrate.

In another aspect, the present invention provides a method of manufacturing a solar cell array comprising; providing a first semiconductor substrate for the epitaxial growth of semiconductor material; forming a first subcell layer on said substrate comprising a first semiconductor material with a first band gap and a first lattice constant; forming a second subcell layer comprising a second semiconductor material with a second band gap and a second lattice constant, wherein the second band gap is less than the first band gap and the second lattice constant is greater than the first lattice constant; forming a lattice constant transition material positioned between the first subcell layer and the second subcell layer, said lattice constant transition material having a lattice constant that changes gradually from the first lattice constant to the second lattice constant; mounting said first and second subcell layer on a carrier; removing said first semiconductor substrate; and etching the first and second subcell layers to the carrier so as to form a plurality of discrete solar cells mounted on the carrier.

In another aspect, the present invention provides a method of manufacturing an array of interconnected solar cells comprising providing a first semiconductor substrate; depositing on the first substrate a sequence of layers of semiconductor material forming a solar cell; mounting a carrier on top of the sequence of layers; and forming a plurality of discrete solar cells from the sequence of layers; and electrically interconnecting the solar cells.

In another aspect, the present invention provides a multijunction solar cell array comprising a plurality of solar cells mounted on a carrier, each solar cell including (i) a first solar subcell having a first band gap, (ii) a second solar subcell disposed over the first solar subcell having a second band gap smaller than the first band gap, (iii) a graded interlayer disposed over the second subcell having a third band gap greater than the second band gap, and (iv) a third solar subcell disposed over the graded interlayer having a fourth band gap smaller than the second band gap such that the third subcell is lattice mismatched with respect to the second subcell; and an electrical interconnect extending between respective pairs of the solar cells to connect the cells in an electrical circuit.

BRIEF DESCRIPTION OF THE DRAWING

The invention will be better and more fully appreciated by reference to the following detailed description when considered in conjunction with the accompanying drawings, wherein.

DESCRIPTION OF THE PREFERRED EMBODIMENTS

Figure 1:
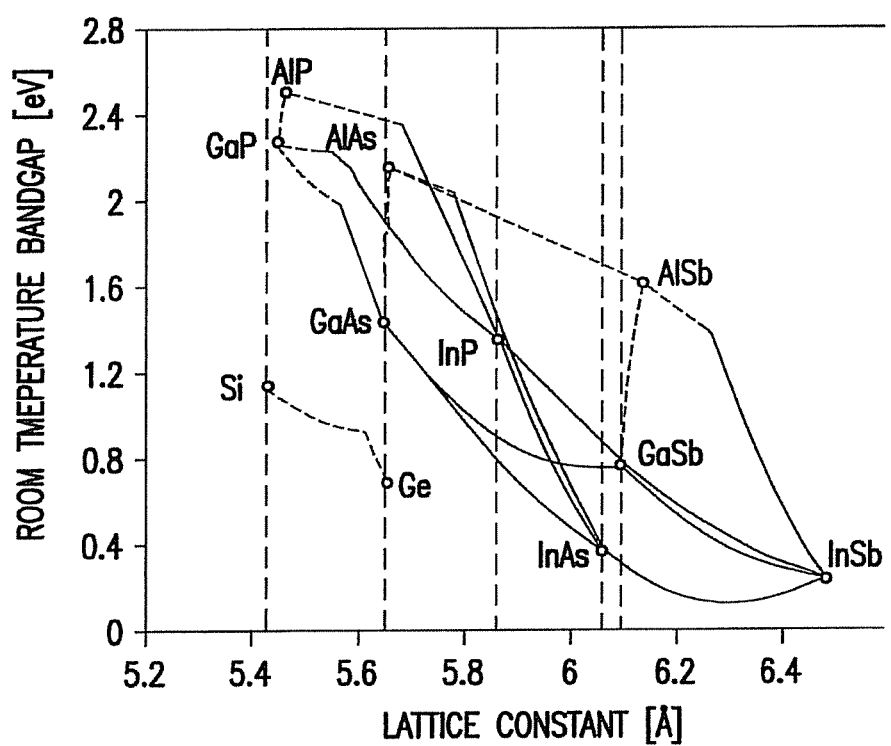
FIG. 1 is a graph representing the band gap of certain binary materials and their lattice constants.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The basic concept of fabricating an inverted metamorphic multijunction (IMM) solar cell is to grow the subcells of the solar cell on a substrate in a "reverse" sequence. That is, the high band gap subcells (i.e. subcells with band gaps in the range of 1.8 to 2.1 eV), which would normally be the "top" subcells facing the solar radiation, are grown epitaxially on a semiconductor growth substrate, such as for example GaAs or Ge, and such subcells are therefore lattice-matched to such substrate. One or more lower band gap middle subcells (i.e. with band gaps in the range of 1.2 to 1.8 eV) can then be grown on the high band gap subcells.

At least one lower subcell is formed over the middle subcell such that the at least one lower subcell is substantially lattice mismatched with respect to the growth substrate and such that the at least one lower subcell has a third lower band gap (i.e. a band gap in the range of 0.7 to 1.2 eV). A surrogate substrate or support structure is provided over the "bottom" or substantially lattice mismatched lower subcell, and the growth semiconductor substrate is subsequently removed. (The growth substrate may then subsequently be re-used for the growth of a second and subsequent solar cells).

The present invention is directed to a method of utilizing the surrogate substrate as a carrier for subsequently forming individual, spaced apart solar cells, and interconnecting such cells in an electrical circuit. More specifically the method includes bonding an inverted photovoltaic cell wafer (i.e. with the top or sunward facing subcell at the top) on a carrier wafer, such as silicon (Si) or germanium (Ge), using an appropriate permanent adhesive, thinning the growth substrate (by grinding/lapping and etching) until the device layers are reached, and then further processing the wafer to make individual solar cells or die, with the top subcell of each solar cell having gridlines, a bus bar, and a top contact. One optional step of the processing would be to make a backcontact for each solar cell accessible from the front side of the wafer, which enables testing on-wafer. In such an embodiment, the backmetal is etched away in-between the individual solar cells, electrically isolating them, but enabling electrical interconnection of the cells on the wafer by welding, soldering or wire bonding, leaving a minimum of two outside terminals or bond pads to the whole wafer.

FIG. 1 is a graph representing the band gap of certain binary materials and their lattice constants. The band gap and lattice constants of ternary materials are located on the lines drawn between typical associated binary materials (such as GaAlAs being between the GaAs and AlAs points on the graph, with the band gap varying between 1.42 eV for GaAs and 2.16 eV for AlAs). Thus, depending upon the desired band gap, the material constituents of ternary materials can be appropriately selected for growth.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), Molecular Beam Epitaxy (MBE), or other vapor deposition methods for the reverse growth may enable the layers in the monolithic semiconductor structure forming the cell to be grown with the required thickness, elemental composition, dopant concentration and grading and conductivity type.

Figure 2:
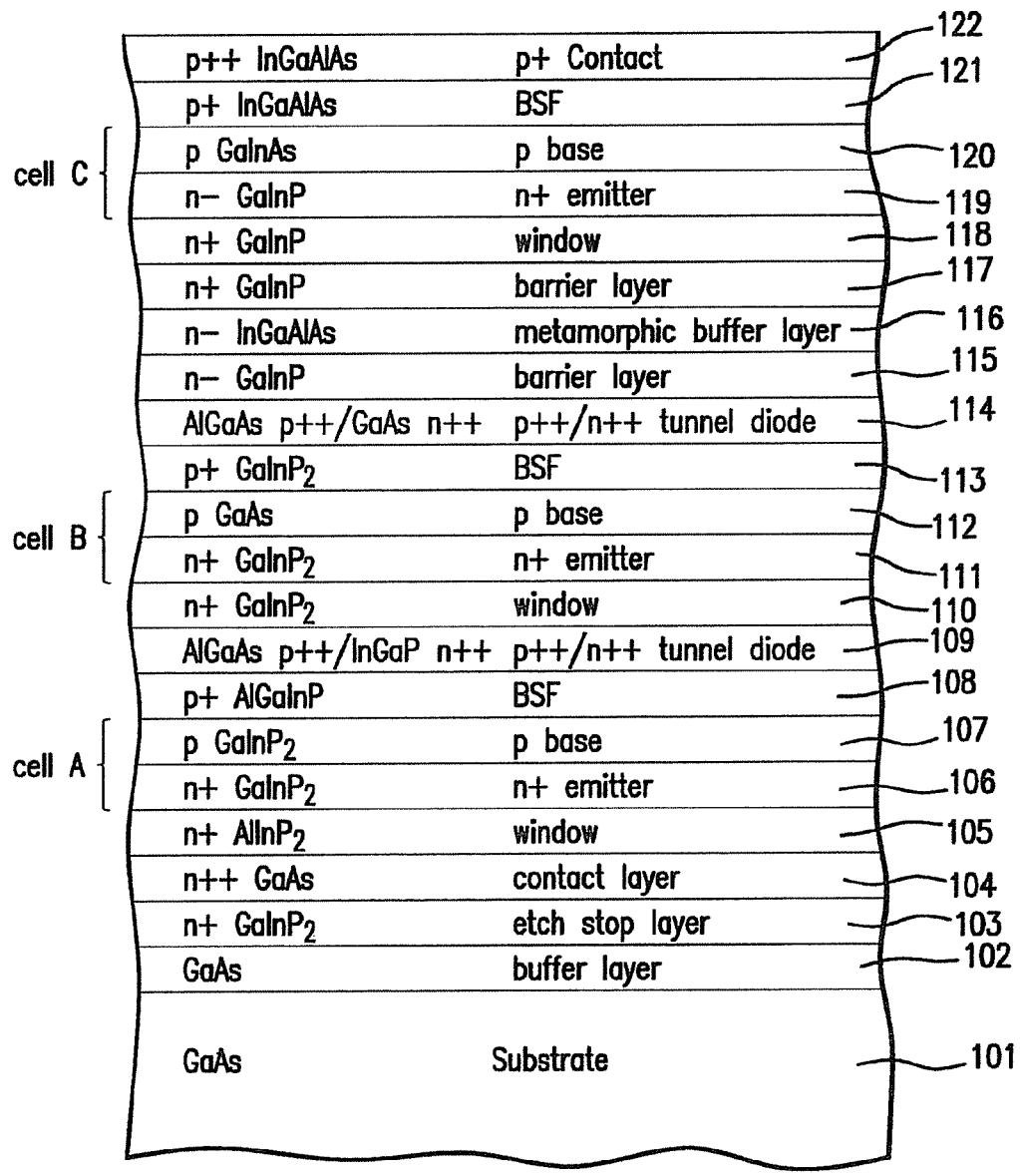
FIG. 2 is a cross-sectional view of the solar cell of the invention after the deposition of semiconductor layers on the growth substrate.

FIG. 2 depicts the multijunction solar cell according to the present invention after the sequential formation of the three subcells A, B and C on a GaAs growth substrate. More particularly, there is shown a substrate 101, which is preferably gallium arsenide (GaAs), but may also be germanium (Ge) or other suitable material. For GaAs, the substrate is preferably a 15° off-cut substrate, that is to say, its surface is orientated 15° off the (100) plane towards the (111)A plane, as more fully described in U.S. patent application Ser. No. 12/047,944, filed Mar. 13, 2008.

In the case of a Ge substrate, a nucleation layer (not shown) is deposited directly on the substrate 101. On the substrate, or over the nucleation layer (in the case of a Ge substrate), a buffer layer 102 and an etch stop layer 103 are further deposited. In the case of GaAs substrate, the buffer layer 102 is preferably GaAs. In the case of Ge substrate, the buffer layer 102 is preferably InGaAs. A contact layer 104 of GaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally lattice matched to the growth substrate 101.

It should be noted that the multijunction solar cell structure could be formed by any suitable combination of group III to V elements listed in the periodic table subject to lattice constant and band gap requirements, wherein the group III includes boron (B), aluminum (Al), gallium (Ga), indium (In), and thallium (Tl). The group IV includes carbon (C), silicon (Si), germanium (Ge), and tin (Sn). The group V includes nitrogen (N), phosphorus (P), arsenic (As), antimony (Sb), and bismuth (Bi).

In one embodiment, the emitter layer 106 is composed of InGa(Al)P and the base layer 107 is composed of InGa(Al)P. The aluminum or Al term in parenthesis in the preceding formula means that Al is an optional constituent, and in this instance may be used in an amount ranging from 0% to 30%. The doping profile of the emitter and base layers 106 and 107 according to the present invention will be discussed in conjunction with FIG. 16.

Subcell A will ultimately become the "top" subcell of the inverted metamorphic structure after completion of the process steps according to the present invention to be described hereinafter.

On top of the base layer 107 a back surface field ("BSF") layer 108 is deposited and used to reduce recombination loss, preferably p+ AlGaInP.

The BSF layer 108 drives minority carriers from the region near the base/BSF interface surface to minimize the effect of recombination loss. In other words, the BSF layer 108 reduces recombination loss at the backside of the solar subcell A and thereby reduces the recombination in the base.

On top of the BSF layer 108 is deposited a sequence of heavily doped p-type and n-type layers 109 which forms a tunnel diode which is an ohmic circuit element to connect subcell A to subcell B. These layers are preferably composed of p++ Al GaAs, and n++ InGaP.

On top of the tunnel diode layers 109 a window layer 110 is deposited, preferably n+ InAlP. The window layer 110 used in the subcell B operates to reduce the interface recombination loss. It should be apparent to one skilled in the art, that additional layer(s) may be added or deleted in the cell structure without departing from the scope of the present invention.

On top of the window layer 110 the layers of subcell B are deposited: the n-type emitter layer 111 and the p-type base layer 112. These layers are preferably composed of InGaP and $In_{0.015}GaAs$ respectively (for a Ge substrate or growth template), or InGaP and GaAs respectively (for a GaAs substrate), although any other suitable materials consistent with lattice constant and band gap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 111 and 112 according to the present invention will be discussed in conjunction with FIG. 16.

In one embodiment of the present invention, the middle subcell emitter has a band gap equal to the top subcell emitter, and the bottom subcell emitter has a band gap greater than the band gap of the base of the middle subcell. Therefore, after fabrication of the solar cell, and implementation and operation, neither the middle subcell B nor the bottom subcell C emitters will be exposed to absorbable radiation. Substantially radiation will be absorbed in the bases of cells B and C, which have narrower band gaps than the emitters. Therefore, the advantages of using heterojunction subcells are: 1) the short wavelength response for both subcells will improve, and 2) the bulk of the radiation is more effectively absorbed and collected in the narrower band gap base. The effect will be to increase $J_{SC}$.

On top of the cell B is deposited a BSF layer 113 which performs the same function as the BSF layer 109. A p++/n++ tunnel diode 114 is deposited over the BSF layer 113 similar to the layers 109, again forming an ohmic circuit element to connect subcell B to subcell C. These layers 114 are preferably composed of p++ Al GaAs and n++ InGaP.

A barrier layer 115, preferably composed of n-type InGa(Al)P, is deposited over the tunnel diode 114, to a thickness of about 1.0 micron. Such barrier layer is intended to prevent threading dislocations from propagating, either opposite to the direction of growth into the middle and top subcells B and C, or in the direction of growth into the bottom subcell A, and is more particularly described in copending U.S. patent application Ser. No. 11/860,183, filed Sep. 24, 2007.

A metamorphic layer (or graded interlayer) 116 is deposited over the barrier layer 115 using a surfactant. Layer 116 is preferably a compositionally step-graded series of InGaAlAs layers, preferably with monotonically changing lattice constant, so as to achieve a gradual transition in lattice constant in the semiconductor structure from subcell B to subcell C while minimizing threading dislocations from occurring. The band gap of layer 116 is constant throughout its thickness preferably approximately 1.5 eV or otherwise consistent with a value slightly greater than the band gap of the middle subcell B. The preferred embodiment of the graded interlayer may also be expressed as being composed of $(In_xGa_{1-x})_yAl_{1-y}As$, with x and y selected such that the band gap of the interlayer remains constant at approximately 1.50 eV.

In the surfactant assisted growth of the metamorphic layer 116, a suitable chemical element is introduced into the reactor during the growth of layer 116 to improve the surface characteristics of the layer. In the preferred embodiment, such element may be a dopant or donor atom such as selenium (Se) or tellurium (Te). Small amounts of Se or Te are therefore incorporated in the metamorphic layer 116 at the end of the growth process, and remain in the finished solar cell. Although Se or Te are the preferred n-type dopant atoms, other non-isoelectronic surfactants may be used as well.

Surfactant assisted growth results in a much smoother or planarized surface. Since the surface topography affects the bulk properties of the semiconductor material as it grows and the layer becomes thicker, the use of the surfactants minimizes threading dislocations in the active regions, and therefore improves overall solar cell efficiency.

As an alternative to the use of non-isoelectronic surfactants one may use an isoelectronic surfactant. The term "isoelectronic" refers to surfactants such as antimony (Sb) or bismuth (Bi), since such elements have the same number of valence electrons as the P of InGaP, or as in InGaAlAs, in the metamorphic buffer layer. Such Sb or Bi surfactants will not typically be incorporated into the metamorphic layer 116.

In an alternative embodiment where the solar cell has only two subcells, and the "middle" cell B is the uppermost or top subcell in the final solar cell, wherein the "top" subcell B would typically have a band gap of 1.8 to 1.9 eV, then the band gap of the interlayer would remain constant at 1.9 eV.

In the inverted metamorphic structure described in the Wanlass et al. paper cited above, the metamorphic layer consists of nine compositionally graded InGaP steps, with each step layer having a thickness of 0.25 micron. As a result, each layer of Wanlass et al. has a different band gap. In the preferred embodiment of the present invention, the layer 116 is composed of a plurality of layers of InGaAlAs, with monotonically changing lattice constant, each layer having the same band gap, approximately 1.5 eV.

The advantage of utilizing a constant band gap material such as InGaAlAs is that arsenide-based semiconductor material is much easier to process in standard commercial MOCVD reactors, while the small amount of aluminum assures radiation transparency of the metamorphic layers.

Although one embodiment of the present invention utilizes a plurality of layers of InGaAlAs for the metamorphic layer 116 for reasons of manufacturability and radiation transparency, other embodiments of the present invention may utilize different material systems to achieve a change in lattice constant from subcell B to subcell C. Thus, the system of Wanlass using compositionally graded InGaP is a second embodiment of the present invention. Other embodiments of the present invention may utilize continuously graded, as opposed to step graded, materials. More generally, the graded interlayer may be composed of any of the As, P, N, Sb based III-V compound semiconductors subject to the constraints of having the in-plane lattice parameter greater or equal to that of the second solar cell and less than or equal to that of the third solar cell, and having a band gap energy greater than that of the second solar cell.

In another embodiment of the present invention, an optional second barrier layer 117 may be deposited over the InGaAlAs metamorphic layer 116. The second barrier layer 117 will typically have a different composition than that of barrier layer 115, and performs essentially the same function of preventing threading dislocations from propagating. In the preferred embodiment, barrier layer 117 is n+ type GaInP.

A window layer 118 preferably composed of n+ type GaInP is then deposited over the barrier layer 117 (or directly over layer 116, in the absence of a second barrier layer). This window layer operates to reduce the recombination loss in subcell "C". It should be apparent to one skilled in the art that additional layers may be added or deleted in the cell structure without departing from the scope of the present invention.

On top of the window layer 118, the layers of cell C are deposited: the n+ emitter layer 119, and the p-type base layer 120. These layers are preferably composed of n type InGaAs and p type InGaAs respectively, or n type InGaP and p type InGaAs for a heterojunction subcell, although other suitable materials consistent with lattice constant and band gap requirements may be used as well. The doping profile of layers 119 and 120 will be discussed in connection with FIG. 16.

A BSF layer 121, preferably composed of InGaAlAs, is then deposited on top of the cell C, the BSF layer performing the same function as the BSF layers 108 and 113.

Finally a high band gap contact layer 122, preferably composed of InGaAlAs, is deposited on the BSF layer 121.

This high band gap contact layer added to the bottom (non-illuminated) side of a lower band gap photovoltaic cell, in a single or a multijunction photovoltaic cell, is formulated to reduce absorption of the light that passes through the cell, so that (1) an ohmic metal contact layer below (non-illuminated side) it will also act as a mirror layer, and (2) the contact layer doesn't have to be selectively etched off, to prevent absorption.

It should be apparent to one skilled in the art, that additional layer(s) may be added or deleted in the cell structure without departing from the scope of the present invention.

Figure 3:
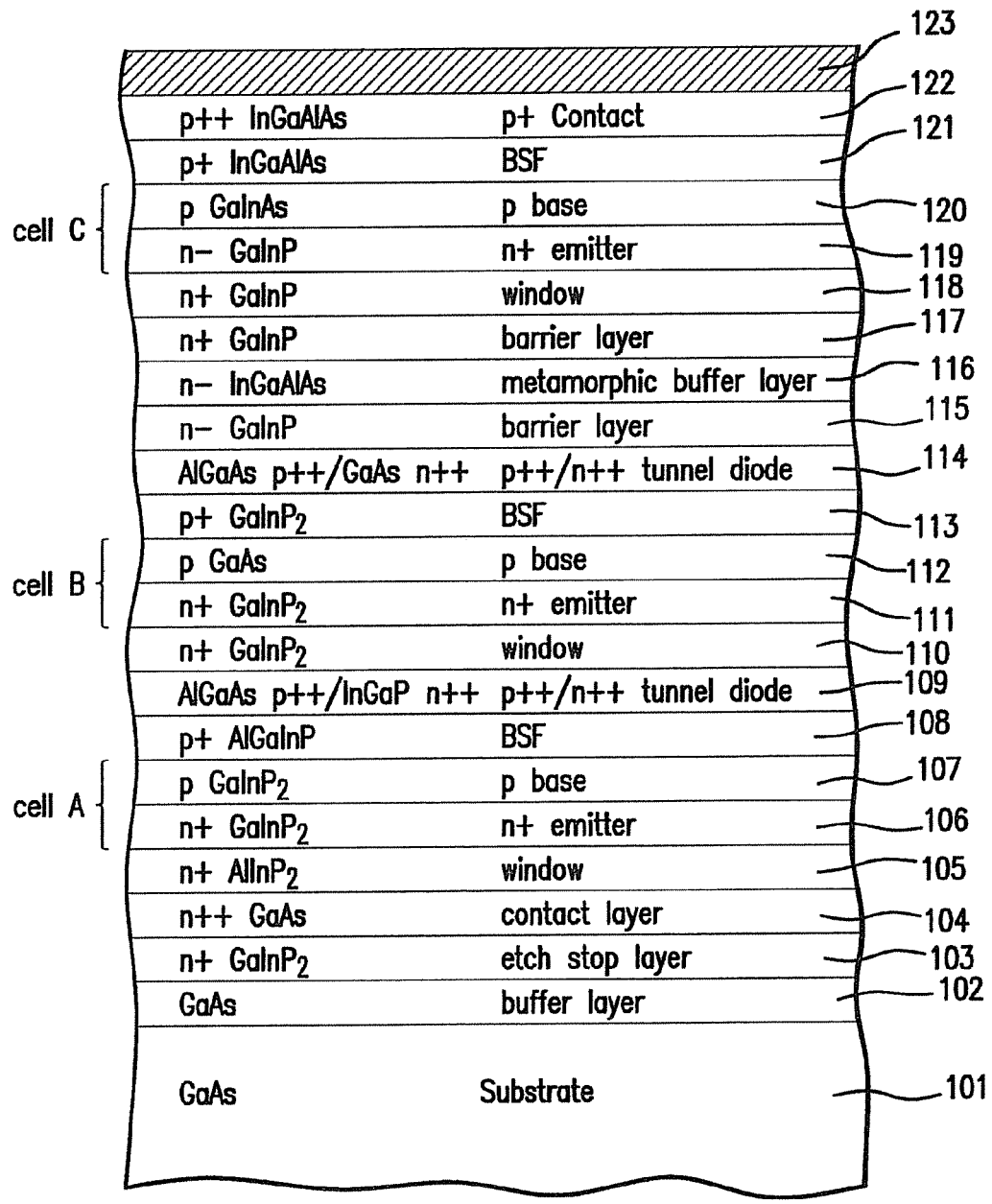
FIG. 3 is a cross-sectional view of the solar cell of FIG. 2 after the next process step.

FIG. 3 is a cross-sectional view of the solar cell of FIG. 2 after the next process step in which a metal contact layer 123 is deposited over the p+ semiconductor contact layer 122. The metal is preferably the sequence of metal layers Ti/Au/Ag/Au.

Also, the metal contact scheme chosen is one that has a planar interface with the semiconductor, after heat treatment to activate the ohmic contact. This is done so that (1) a dielectric layer separating the metal from the semiconductor doesn't have to be deposited and selectively etched in the metal contact areas; and (2) the contact layer is specularly reflective over the wavelength range of interest.

Figure 4:
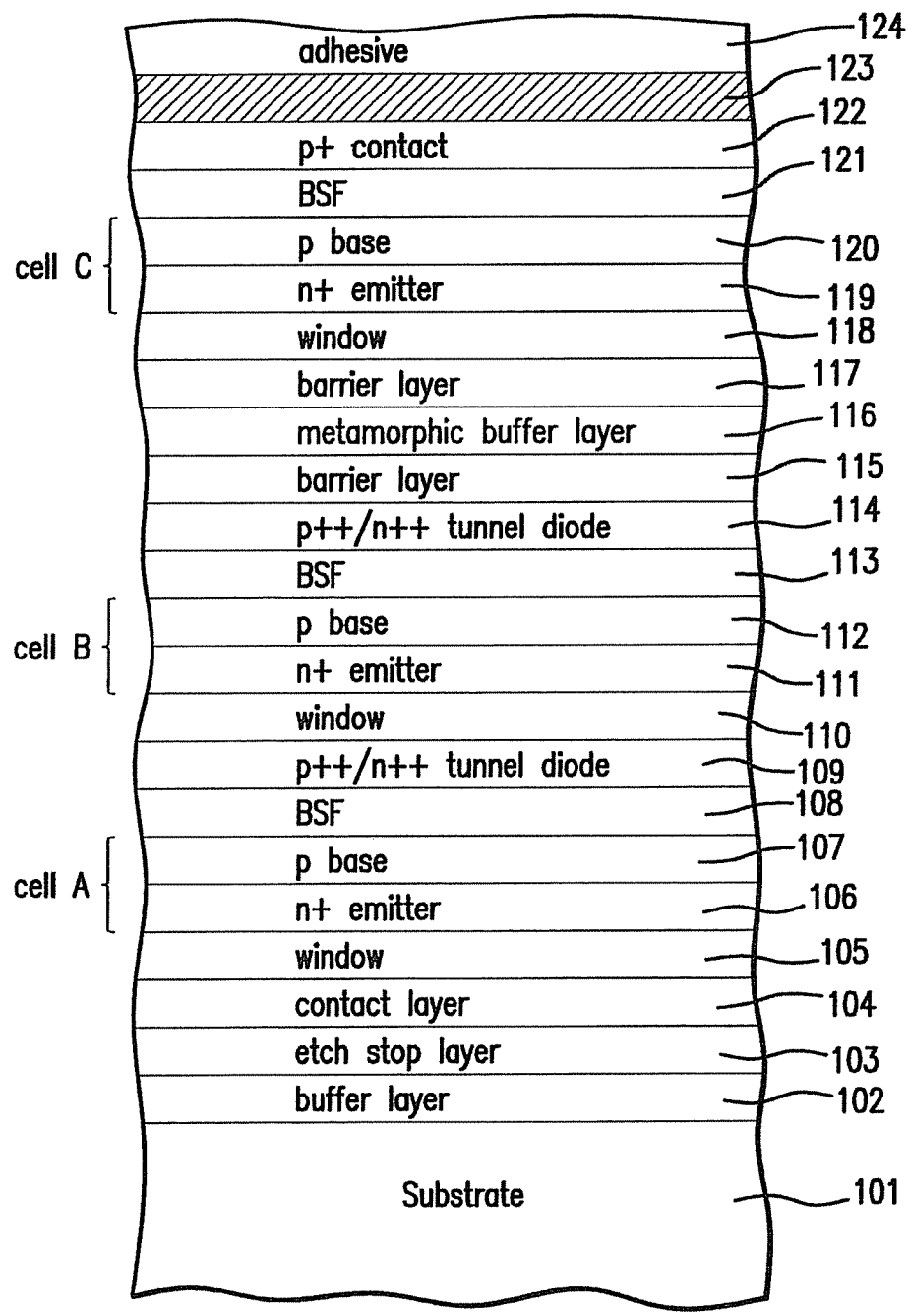
FIG. 4 is a cross-sectional view of the solar cell of FIG. 3 after next process step.

FIG. 4 is a cross-sectional view of the solar cell of FIG. 3 after the next process step in which an adhesive layer 124 is deposited over the metal layer 123. The adhesive is preferably Wafer Bond (manufactured by Brewer Science, Inc. of Rolla, Mo.).

Figure 5A:
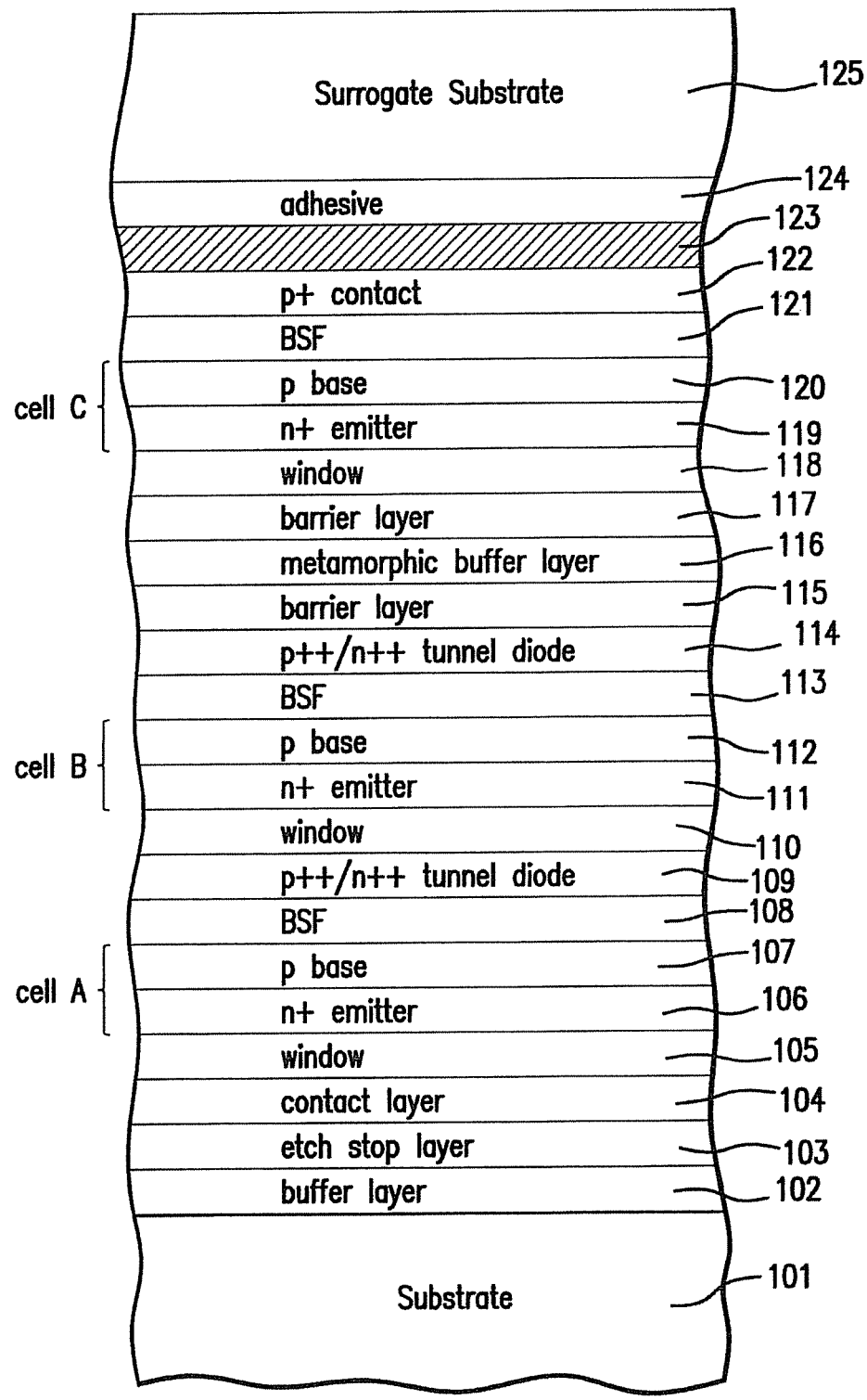
FIG. 5A is a cross-sectional view of the solar cell of FIG. 4 after the next process step in which a surrogate substrate is attached.

FIG. 5A is a cross-sectional view of the solar cell of FIG. 4 after the next process step in which a surrogate substrate 125, preferably sapphire, is attached. Alternatively, the surrogate substrate may be GaAs, Ge or Si, or other suitable material. The surrogate substrate is about 40 mils in thickness, and is perforated with holes about 1 mm in diameter, spaced 4 mm apart, to aid in subsequent removal of the adhesive and the substrate. As an alternative to using an adhesive layer 124, a suitable substrate (e.g., GaAs) may be eutectically bonded to the metal layer 123.

Figure 5B:
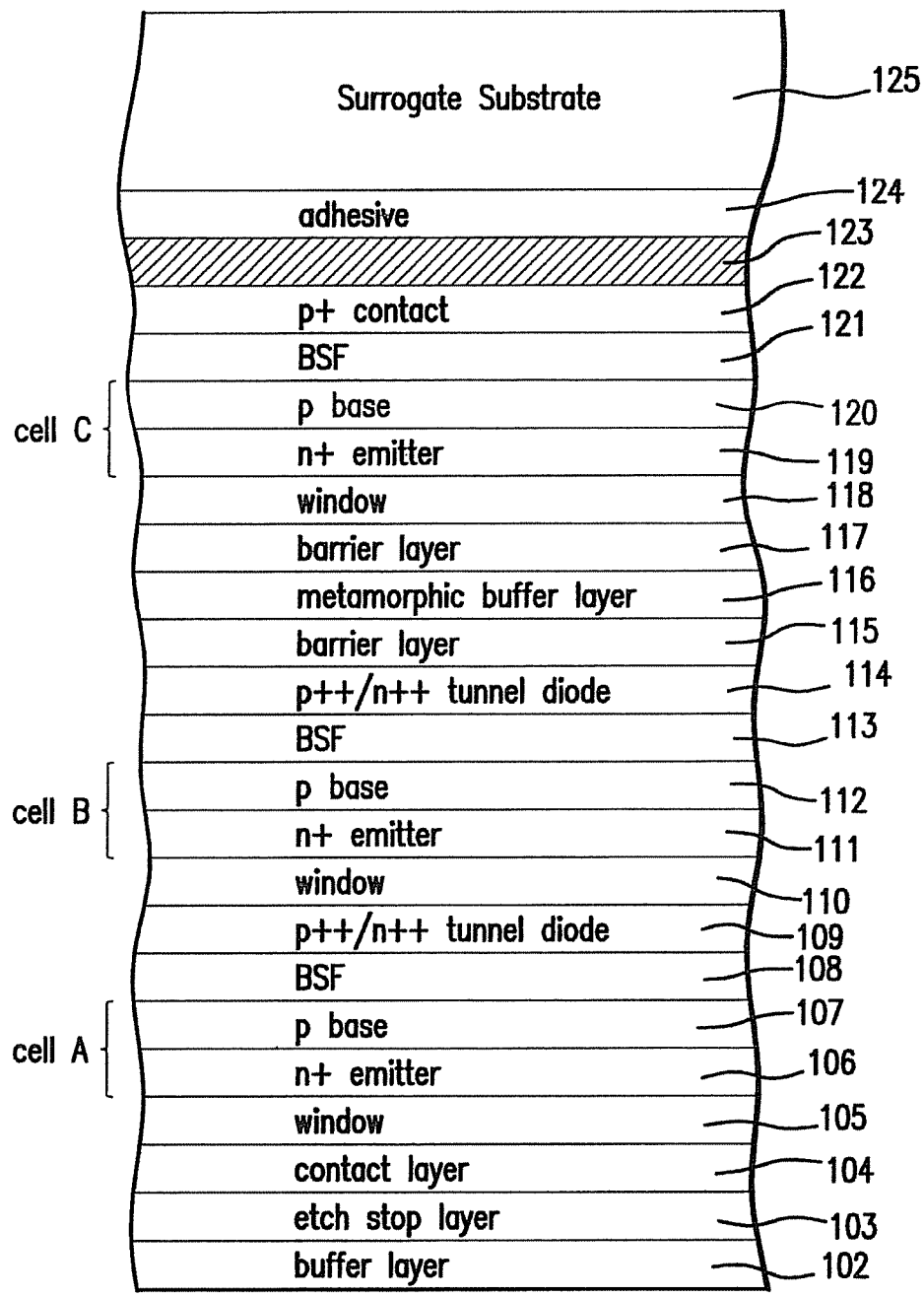
FIG. 5B is a cross-sectional view of the solar cell of FIG. 5A after the next process step in which the original substrate is removed.

FIG. 5B is a cross-sectional view of the solar cell of FIG. 5A after the next process step in which the original substrate is removed by a sequence of lapping and/or etching steps in which the substrate 101, and the buffer layer 103 are removed. The choice of a particular etchant is growth substrate dependent.

Figure 5C:
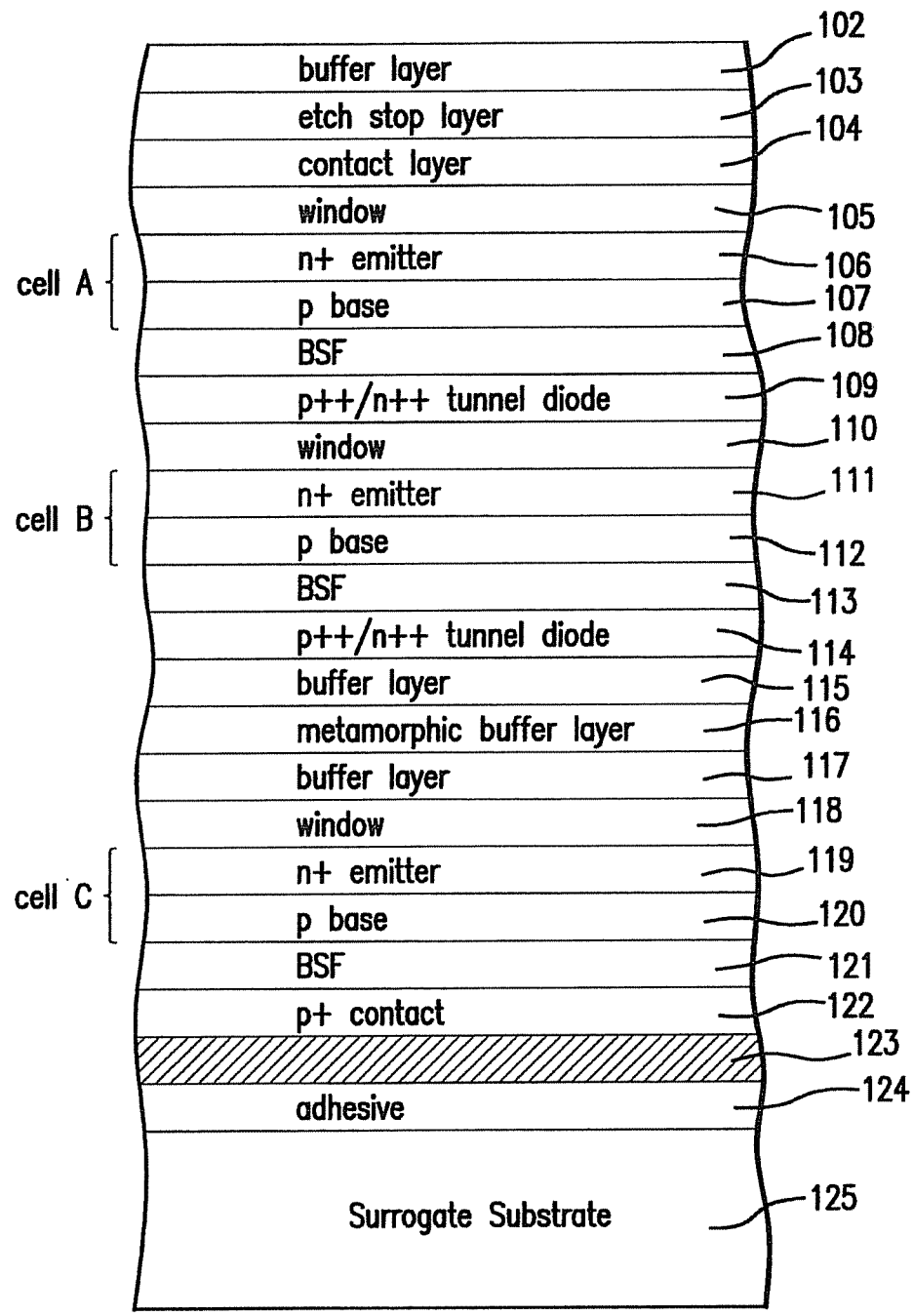
FIG. 5C is another cross-sectional view of the solar cell of FIG. 5B with the surrogate substrate on the bottom of the Figure.

FIG. 5C is a cross-sectional view of the solar cell of FIG. 5B with the orientation with the surrogate substrate 125 being at the bottom of the Figure. Subsequent Figures in this application will assume such orientation.

Figure 6:
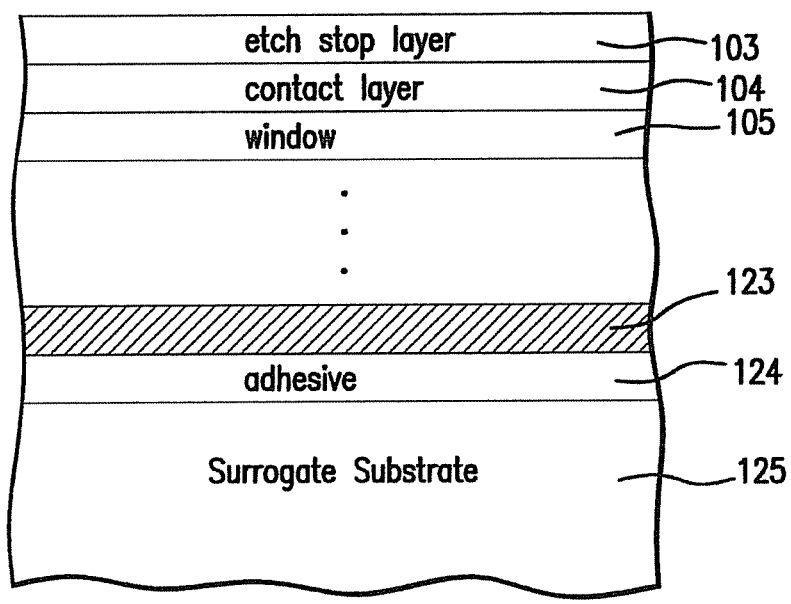
FIG. 6 is a simplified cross-sectional view of the solar cell of FIG. 5C after the next process step.

FIG. 6 is a simplified cross-sectional view of the solar cell of FIG. 5B depicting just a few of the top layers and lower layers over the surrogate substrate 125.

Figure 7:
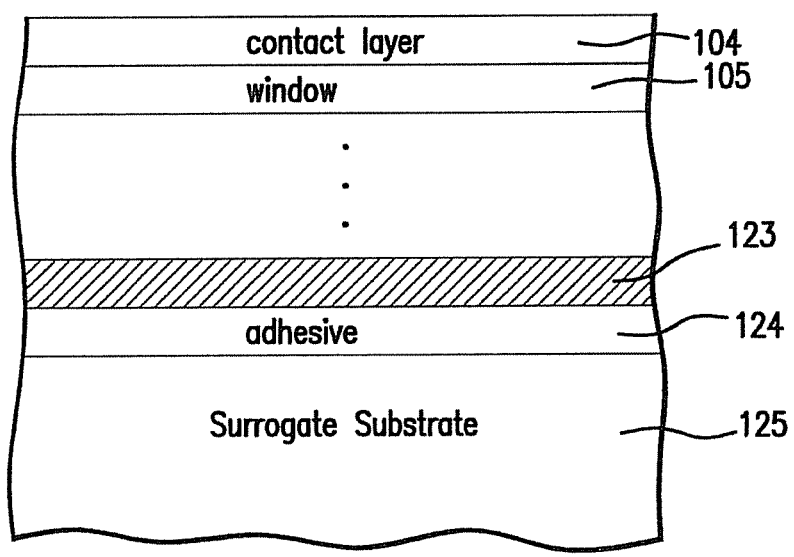
FIG. 7 is a cross-sectional view of the solar cell of FIG. 6 after the next process step.

FIG. 7 is a cross-sectional view of the solar cell of FIG. 6 after the next process step in which the etch stop layer 103 is removed by a HCl/H$_2$O solution.

Figure 8:
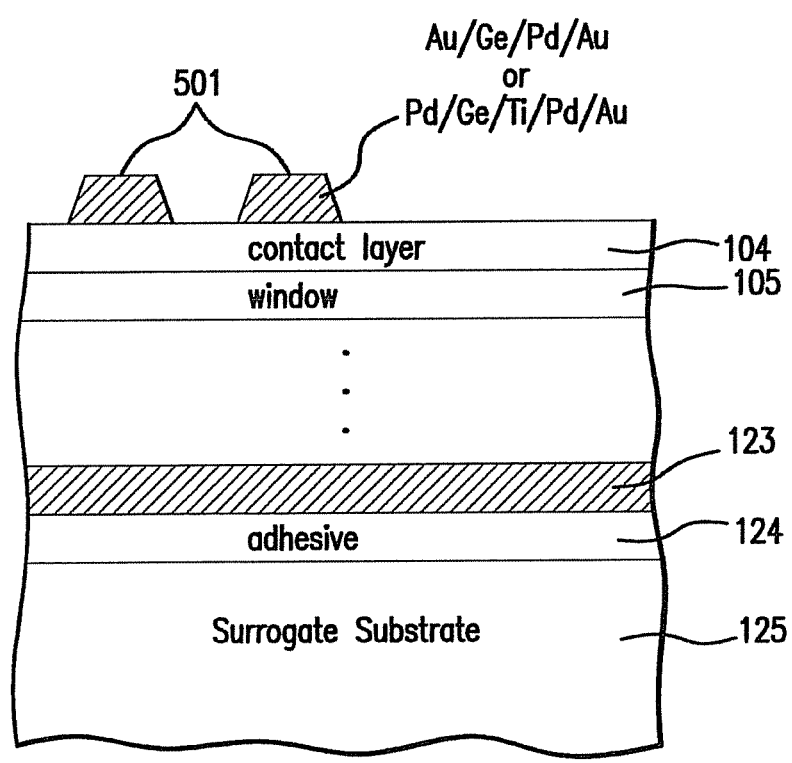
FIG. 8 is a cross-sectional view of the solar cell of FIG. 7 after the next process step.

FIG. 8 is a cross-sectional view of the solar cell of FIG. 7 after the next sequence of process steps in which a photoresist mask (not shown) is placed over the contact layer 104 to form the grid lines 501. As will be described in greater detail below, the grid lines 501 are deposited via evaporation and lithographically patterned and deposited over the contact layer 104. The mask is subsequently lifted off to faun the finished metal grid lines 501 as depicted in the Figures.

The grid lines 501 are formed as follows. Prior to the metal deposition, of the n-contact, residual oxide is removed by soaking the wafer in a solution of 15H$_2$O:1NH$_4$OH for one minute and spin dried in N$_2$. The wafer is loaded in the deposition chamber within 30 minutes to preclude excessive oxide growth. The metallization in the preferred embodiment, the sequence of layers of (50 nm Pd/100 nm Ge/30 nm Ti/30 nm Pd/5·mu·m Ag/100 nm Au) is e-beam evaporated during one vacuum cycle. The background chamber pressure at the beginning of deposition is 5×10$^{-7}$ torr. Following deposition, the grid lines 501 and bus bar are defined by liftoff. The contact sintering is performed in lab ambient atmosphere on a hot plate. The wafer is placed grid side down on a clean silicon wafer on a hot plate set at 120° C. The wafer and silicon carrier are allowed to equilibrate for 5 min. The hot plate is then set at the sintering temperature (set point 215). Ten minutes is allowed for the wafer to attain the sintering temperature. The contact then sinters for 40 min. The hot plate temperature is then dropped in ten minutes to 120° C. The Si carrier and wafer are removed from the hot plate.

The preferred embodiment of the contact composition according to the present invention, Pd/Ge/Ti/Pd/Au, is illustrated in FIG. 8.

Figure 9:
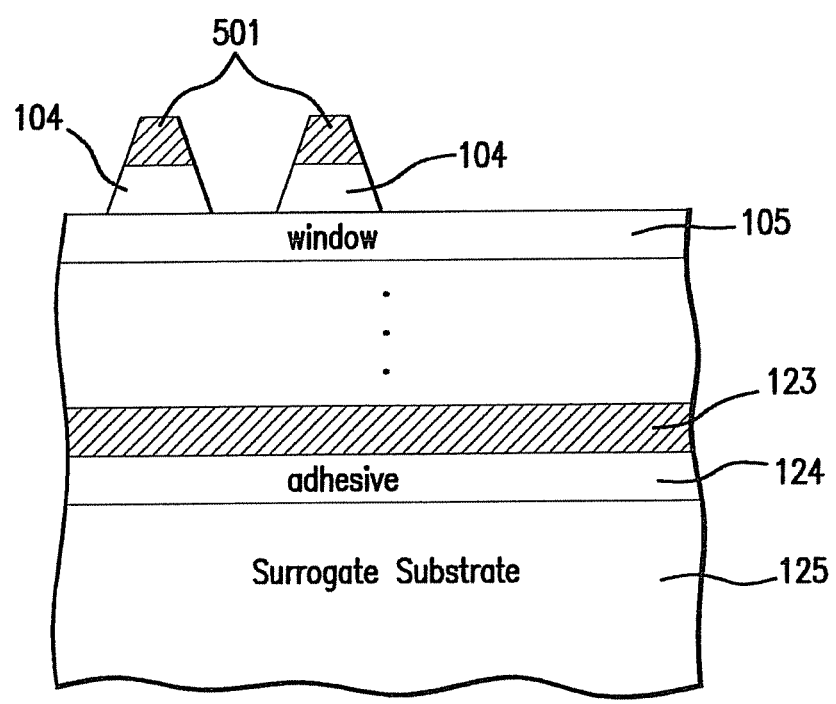
FIG. 9 is a cross-sectional view of the solar cell of FIG. 8 after the next process step.

FIG. 9 is a cross-sectional view of the solar cell of FIG. 8 after the next process step in which the grid lines are used as a mask to etch down the surface to the window layer 105 using a citric acid/peroxide etching mixture.

Figure 10A:
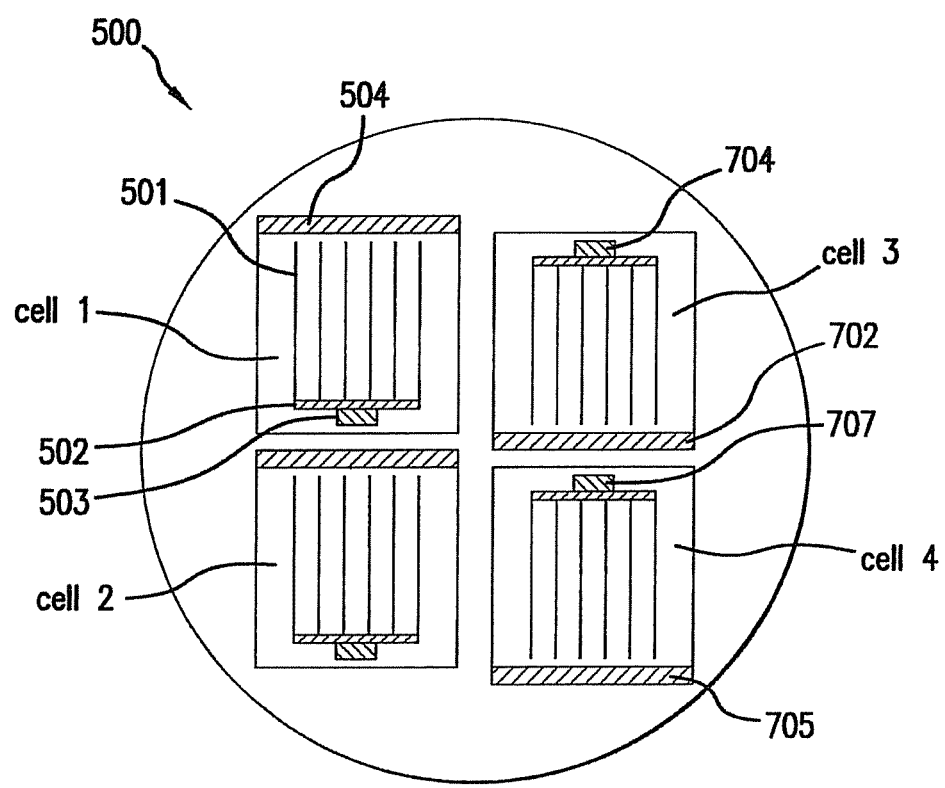
FIG. 10A is a top plan view of a wafer in which the solar cells are fabricated.

FIG. 10A is a top plan view of a wafer in which four solar cells are implemented. The depiction of four cells is for illustration purposes only, and the present invention is not limited to any specific number of cells per wafer.

In each cell, but in this paragraph referring solely to the specific elements of cell 1, there are grid lines 501 (more particularly shown in cross-section in FIG. 9), an interconnecting bus line 502, and a contact pad 503 electrically connected to the bus line 502. The geometry and number of grid and bus lines is illustrative and the present invention is not limited to the illustrated embodiment. A portion of the top surface of each of the cells is etched down to the metal layer 123 to form a contact pad 504 to the metal layer 123 that is accessible from the front side of the wafer.

Figure 10B:
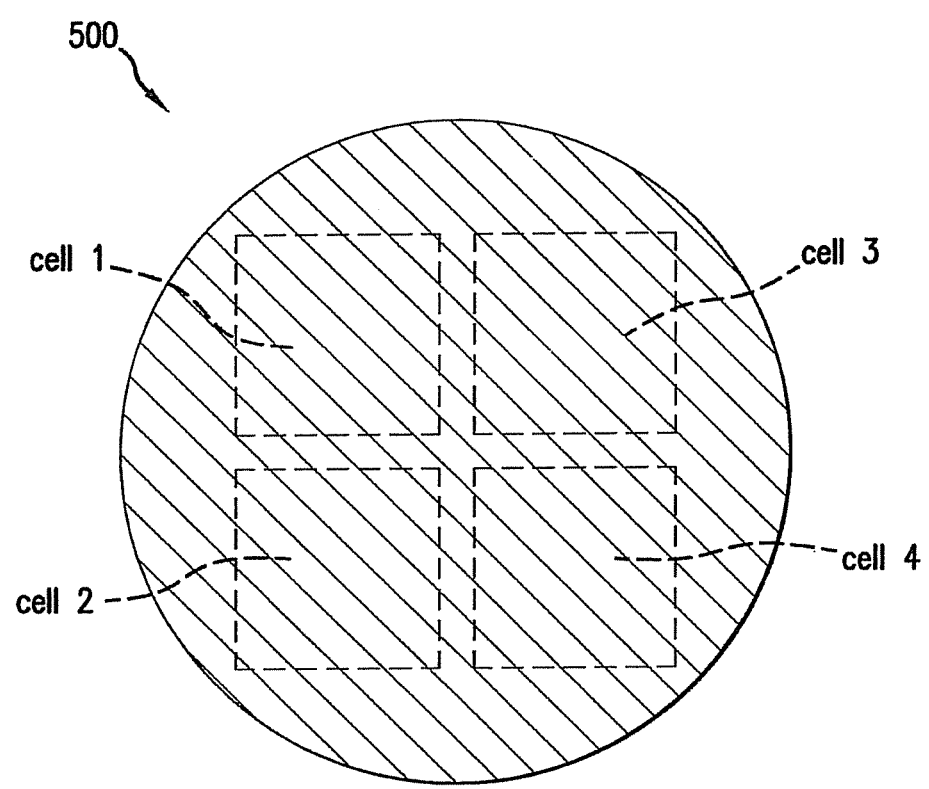
FIG. 10B is a bottom plan view of a wafer in which the solar cells are fabricated.
Figure 15:
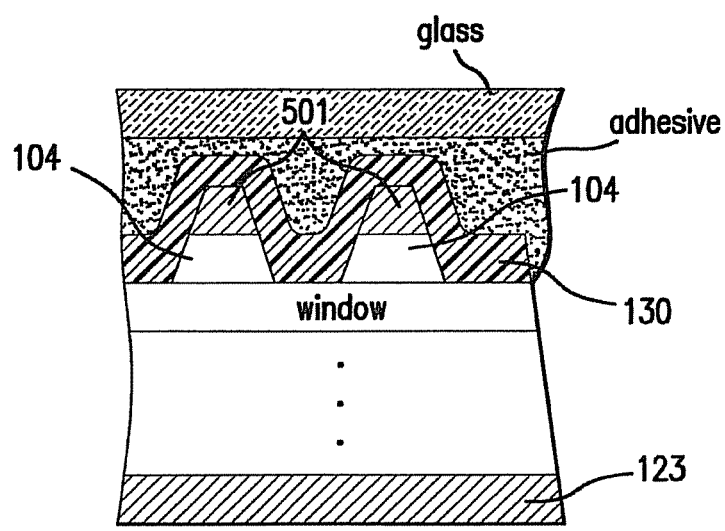
FIG. 15 is a cross-sectional view of the solar cell of FIG. 14B after the next process step in a third embodiment of the present invention.

FIG. 10B is a bottom plan view of the wafer with four solar cells shown in FIG. 10A. The metal contact layer 123, as shown in the cross-sectional view of FIG. 15 is depicted.

Figure 10C:
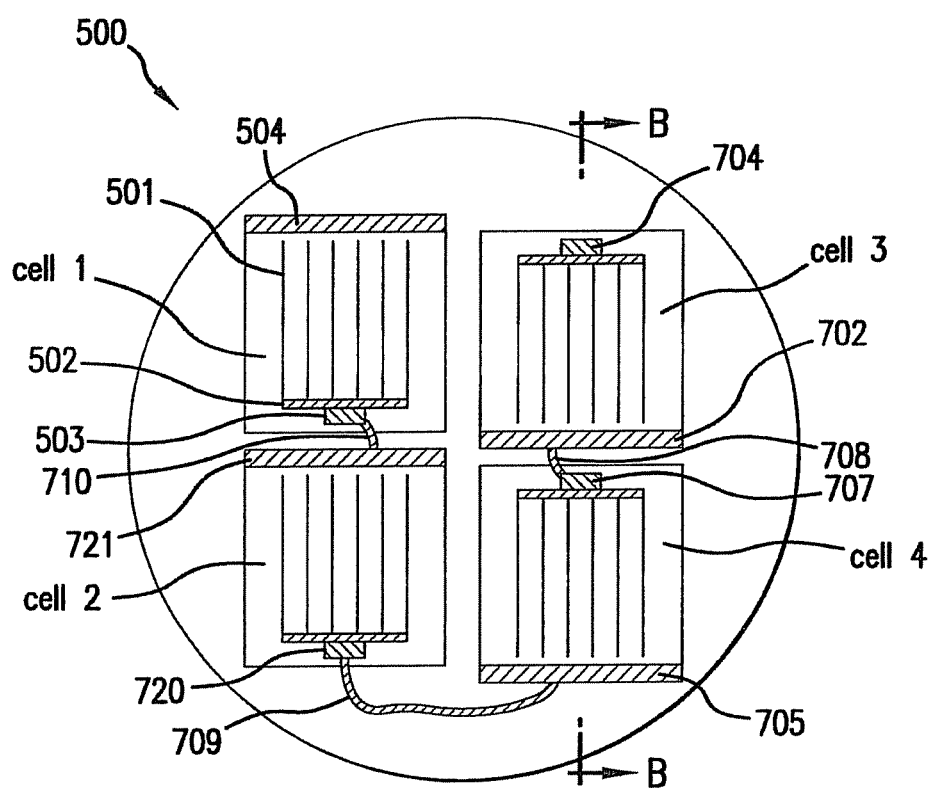
FIG. 10C is a top plan view of a wafer in which the solar cells are interconnected according to a first embodiment of the present invention.
Figure 18:
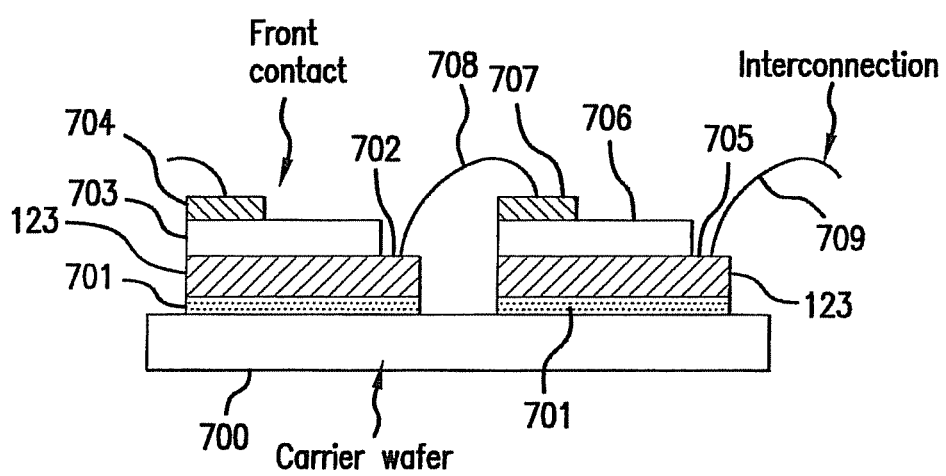
FIG. 18 is a cross-sectional view of an interconnection scheme of an array of solar cells according to a first embodiment of present invention.

FIG. 10C is a top plan view of a wafer in which the solar cells are interconnected according to a first embodiment of the present invention in which wire bonds are used as the electrical interconnects. More specifically, wire bond 708 electrically connects the bottom contact pad 702 of cell 3 with the front contact pad 707 of cell 4. Similarly wire bond 709 connects bottom contact pad 705 of cell 4 and front contact pad 720 of cell 2, and wire bond 710 connects bottom contact pad 721 with front contact pad 503 of cell 1. The cross-sectional view of this wafer through the B-B plane is shown in FIG. 18.

Figure 10D:
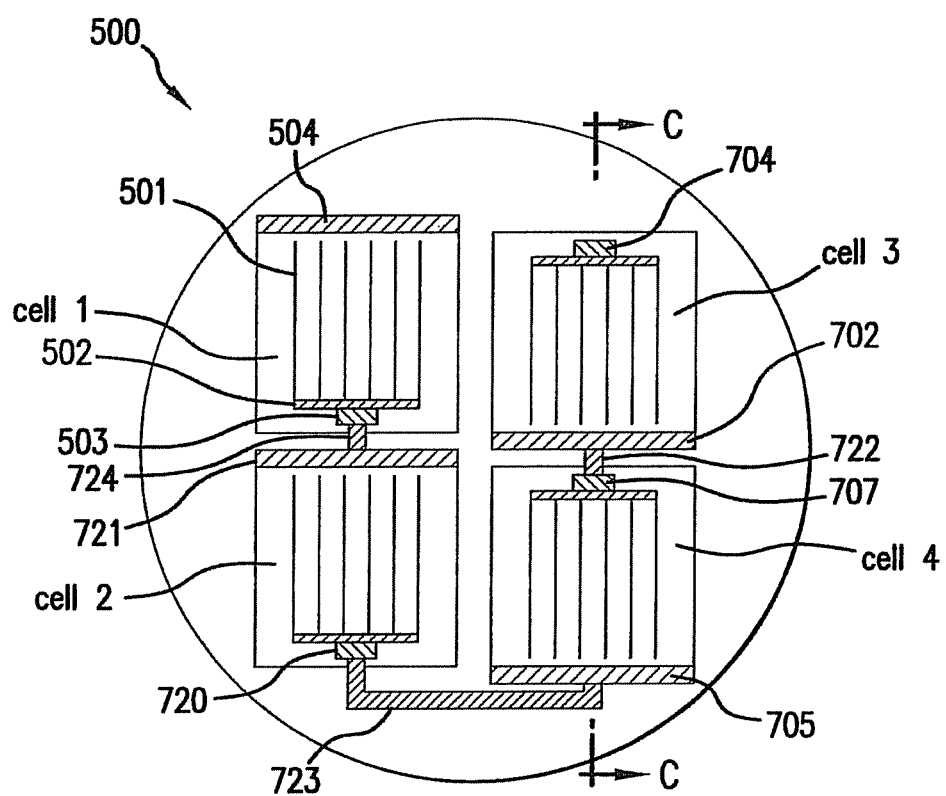
FIG. 10D is a top plan view of a wafer in which the solar cells are interconnected according to a second embodiment of the present invention.

FIG. 10D is a top plan view of a wafer in which the solar cells are interconnected according to a second embodiment of the present invention by a thin film metal interconnects.

Figure 19:
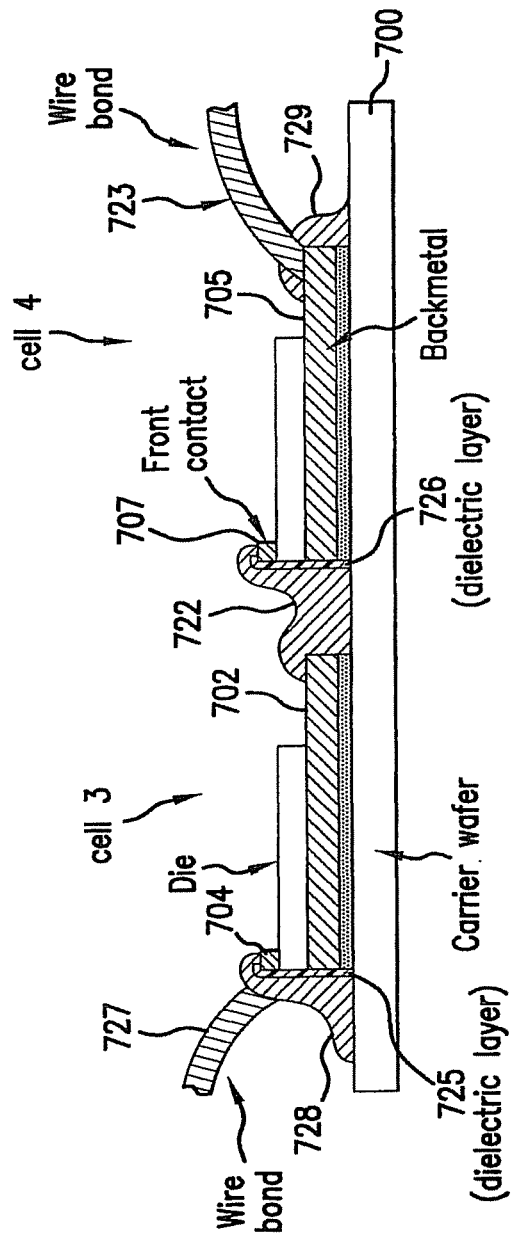
FIG. 19 is a cross-sectional view of an interconnection scheme of an array of solar cells according to a second embodiment of the present invention.

More specifically, the Figure depicts the embodiment in which thin film interconnect 722 connects the bottom contact pad 702 of cell 3 with front contact pad 707 of cell 4. Similarly, thin film interconnect 723 connects bottom pad 705 of cell 4 with front contact part 720 of cell 2. Thin film interconnect 724 connects bottom pad 724 of cell 2 with front contact pad 503 of cell 1. The cross-sectional view of the wafer through the C-C plane is shown in FIG. 19.

Figure 11:
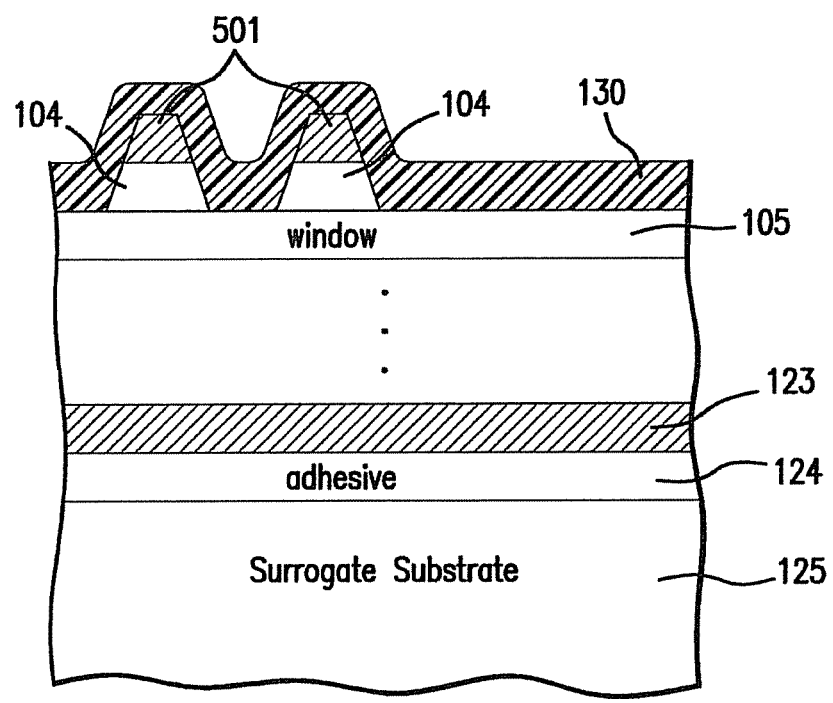
FIG. 11 is a cross-sectional view of the solar cell of FIG. 9 after the next process step.

FIG. 11 is a cross-sectional view of the solar cell of FIG. 9 after the next process step in which an antireflective (ARC) dielectric coating layer 130 is applied over the entire surface of the "bottom" side of the wafer with the grid lines 501.

Figure 12:
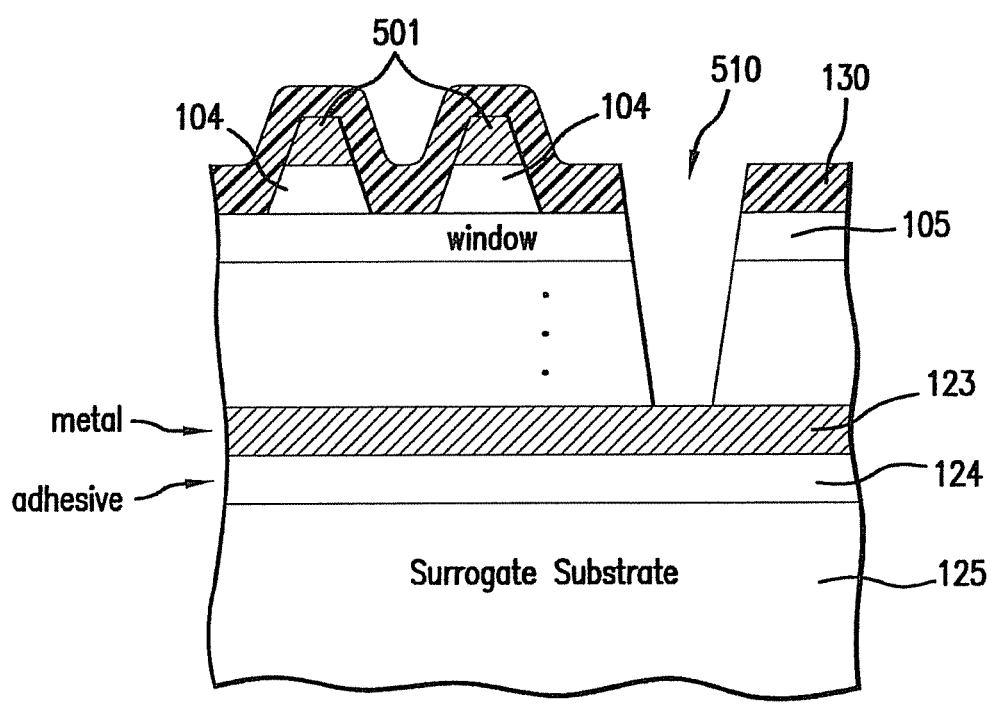
FIG. 12 is a cross-sectional view of the solar cell of FIG. 11 after the next process step.

FIG. 12 is a cross-sectional view of the solar cell of FIG. 11 after the next process step according to the present invention in which a channel 510 or portion of the semiconductor structure is etched down to the metal layer 123 using phosphide and arsenide etchants defining a peripheral boundary and leaving a mesa structure which constitutes the solar cell. The cross-section depicted in FIG. 12 is that as seen from the A-A plane shown in FIG. 13.

Figure 14A:
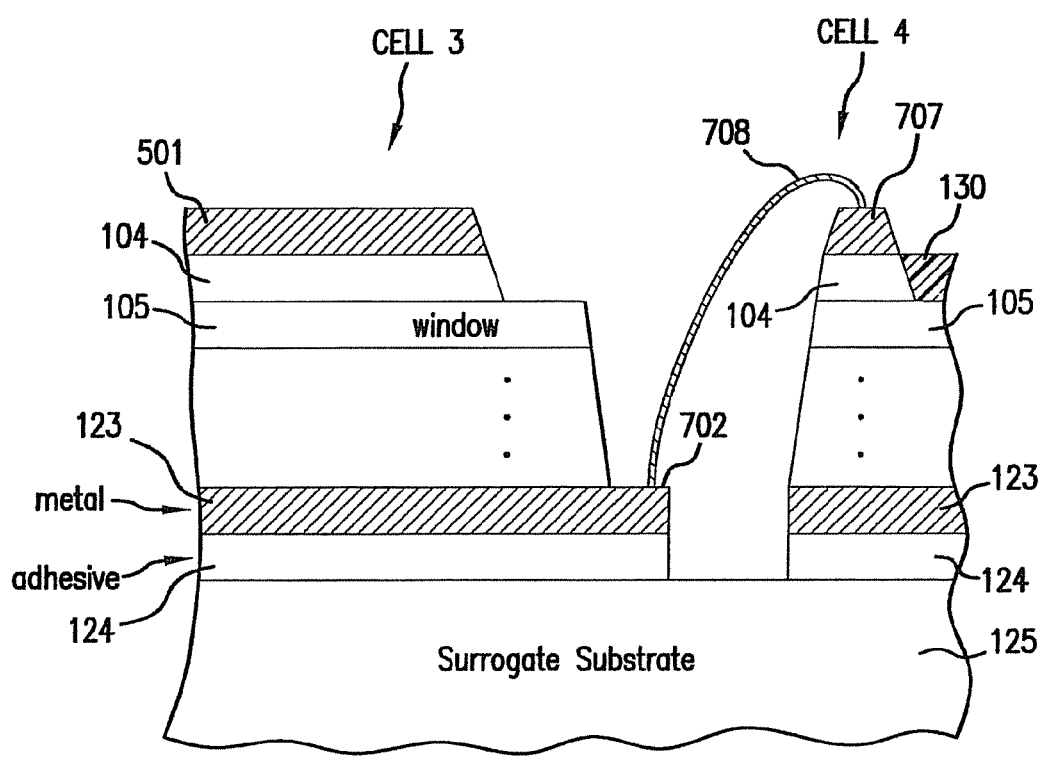
FIG. 14A is an enlarged cross-sectional view of the solar cell of FIG. 10C after the next process step in a first embodiment of the present invention.

The same etching process which forms the channel 510 is used to form the contact pad 504 to metal layer 123. Reference may be made to FIG. 14A described below.

Figure 13:
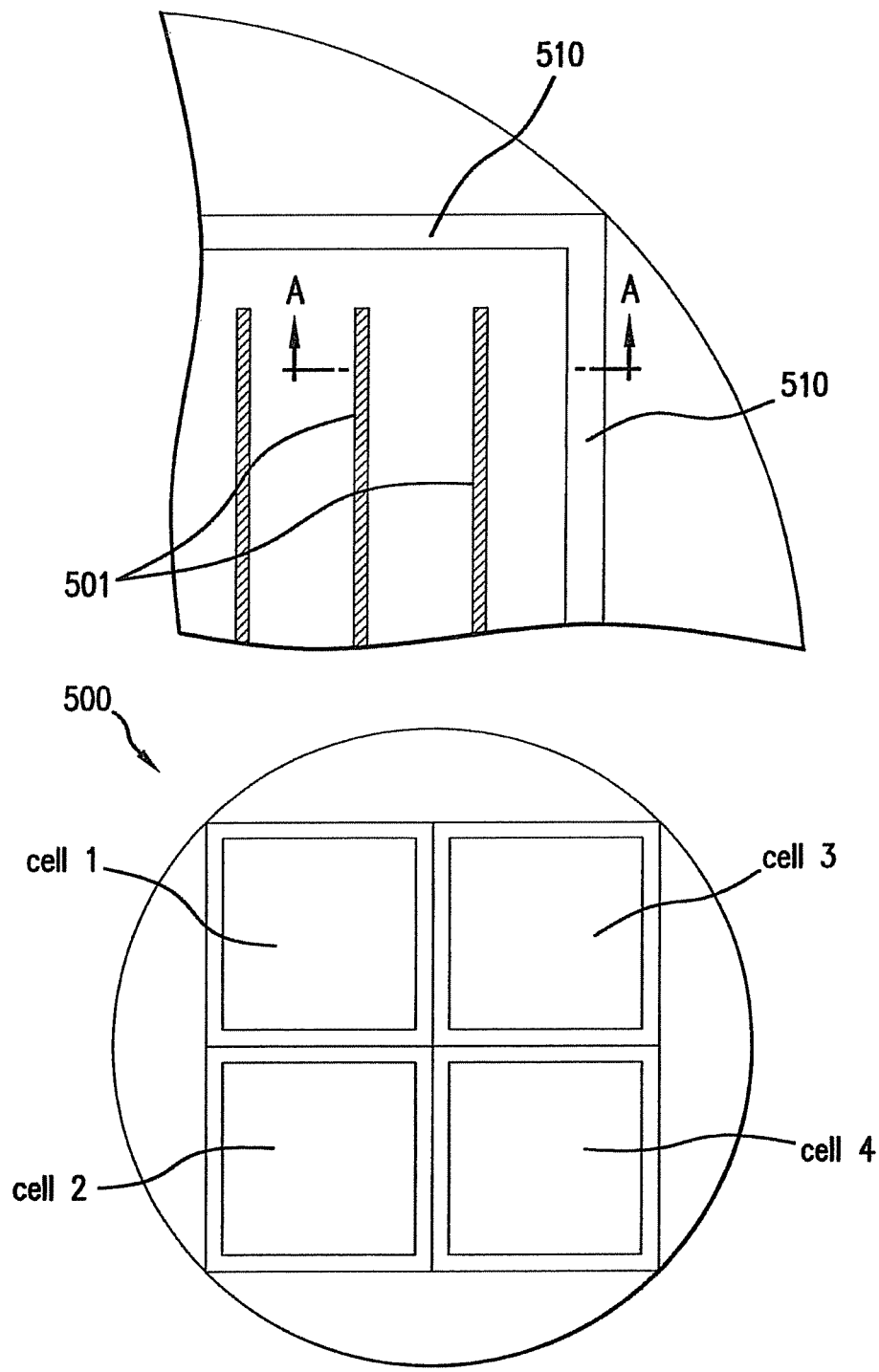
FIG. 13 is a top plan view of the wafer of FIG. 12 depicting the surface view of the trench etched around a cell.

FIG. 13 is a top plan view of the wafer of FIG. 12 depicting the channel 510 etched around the periphery of each cell using phosphide and arsenide etchants.

FIG. 14A is an enlarged cross-sectional view of the solar cell of FIG. 10C between cell 3 and cell 4 showing a wire bond 708 electrically interconnecting bottom contact pad 702 and front contact pad 707 of adjacent solar cells mounted on surrogate substrate or support 124.

Figure 14B:
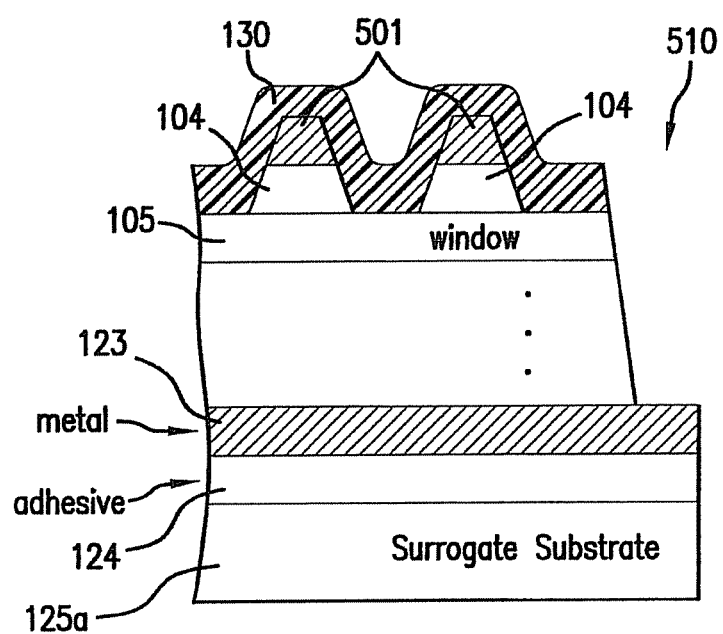
FIG. 14B is a cross-sectional view of the solar cell of FIG. 12 after the next process step in a second embodiment of the present invention.

FIG. 14B is a cross-sectional view of the solar cell of FIG. 12 after the next process step in a first embodiment of the present invention in which the surrogate substrate 125 is appropriately thinned to a relatively thin layer 125a, by grinding, lapping, or etching.

Figure 14C:
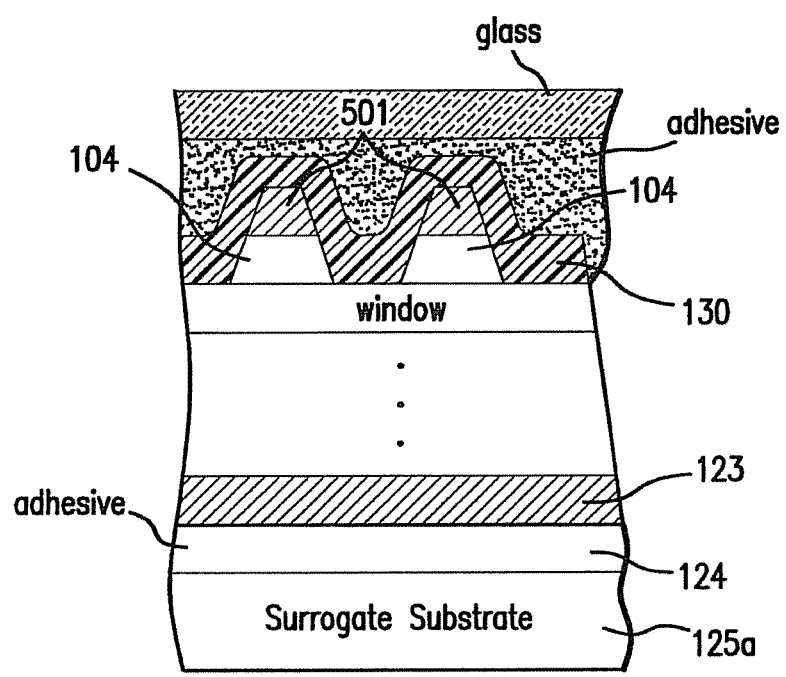
FIG. 14C is a cross-sectional view of the solar cell of FIG. 14B after the next process step.

FIG. 14C is a cross-sectional view of the solar cell of FIG. 14B after the next process step in a second embodiment of the present invention in which a cover glass is secured to the top of the cell by an adhesive.

FIG. 15 is a cross-sectional view of the solar cell of FIG. 14C after the next process step in a third embodiment of the present invention in which a cover glass is secured to the top of the cell and the surrogate substrate 125 is entirely removed, leaving only the metal contact layer 123 which forms the backside contact of the solar cell. The surrogate substrate may be reused in subsequent wafer processing operations.

Figure 16:
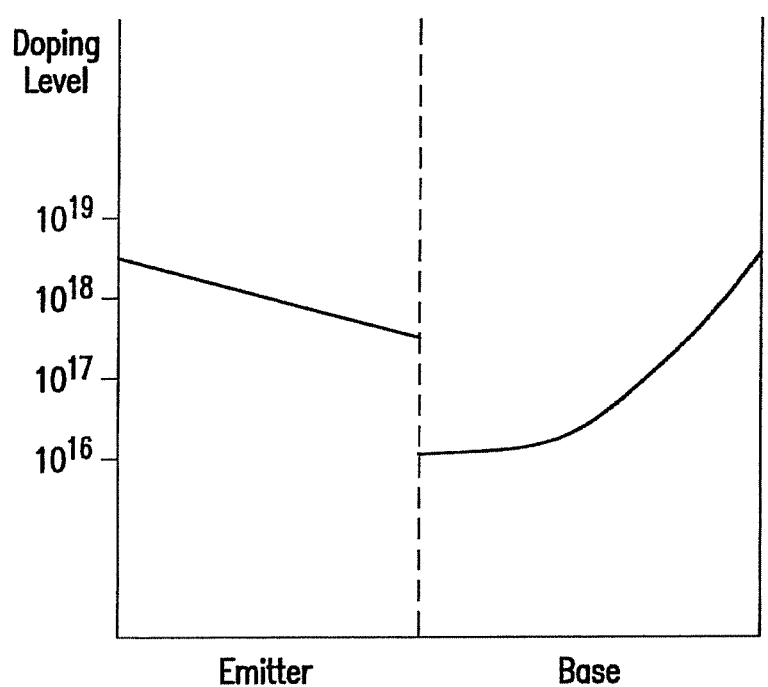
FIG. 16 is a graph of the doping profile in a base layer in the metamorphic solar cell according to the present invention.

FIG. 16 is a graph of a doping profile in the emitter and base layers in one or more subcells of the inverted metamorphic multijunction solar cell of the present invention. The various doping profiles within the scope of the present invention, and the advantages of such doping profiles are more particularly described in copending U.S. patent application Ser. No. 11/956,069 filed Dec. 13, 2007, herein incorporated by reference. The doping profiles depicted herein are merely illustrative, and other more complex profiles may be utilized as would be apparent to those skilled in the art without departing from the scope of the present invention.

Figure 17:
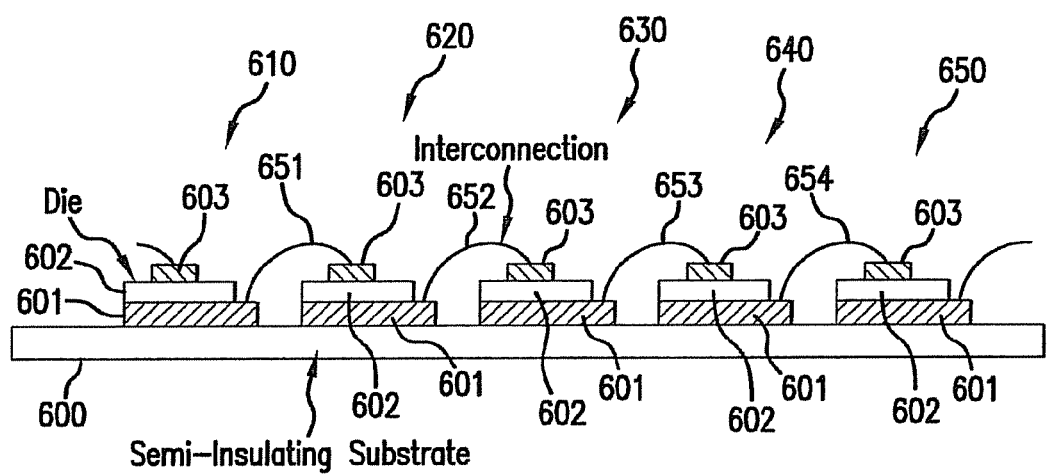
FIG. 17 is a cross-sectional view of an interconnection scheme of an array of solar cells according to the prior art.

FIG. 17 is a cross-sectional view of an interconnection scheme of an array of thermophotovoltaic cells known in the prior art. The Figure depicts an InP wafer 600 which forms a semi-insulating substrate on which a number of discrete thermophotovoltaic devices are formed. More particularly, the wafer or substrate 600 is used as a growth substrate on which a lateral conduction layer 601, and active layers 602 of semiconductor material are grown. After growth of the active layers 602, a photolithographic process is used to pattern the layers 601, 602 into spaced apart discrete devices 610, 620, 630, 640 and 650. The lateral conduction layer 601 associated with device 610 extends peripherally beyond the edges of the active layer 602 of device 610 to form a contact pad or area to allow a wire bond or other electrical interconnect 651 (such as a thin film interconnect) to be made to the bottom or first terminal of device 610. Such devices are sometimes referred to as a MIM (Monolithic Interconnected Module).

A top contact layer 603 (such as a metal bond pad) is formed on the top of the active layers of device 610, to allow a wire bond or other electrical interconnect to be made to the top, or second terminal, of device 610. Similar terminal pad structures and electrical interconnects are associated with respective devices 620, 630, 640 and 650 as depicted in the Figure.

After formation of the discrete devices 610, 620, 630, 640 and 650, wire bonds 651, 652, 653, and 654 interconnect the devices. More specifically, wire bond 651 extends from layer 601 of device 610 to layer 603 of device 620. Similar interconnections are made from 620 to 630, etc. In MIMs, thin film metal interconnects are utilized.

The use of back contacts and wire bond interconnections is also discussed in related U.S. patent application Ser. No. 11/860,142 filed Sep. 24, 2007.

FIG. 18 is a cross-sectional view of an interconnection scheme of an array of photovoltaic cells according to a first embodiment of the present invention, depicting the cross-section through the B-B plane of FIG. 10C. The Figure depicts the carrier wafer 700 with two discrete photovoltaic devices 703 and 706 shown in cross-section. More particularly, the wafer or substrate 700 is adhesively attached by adhesive 701 to back metal contact 123 of the wafer 500 (as shown in FIG. 10B), and a photolithographic process is used to pattern the wafer into spaced apart discrete devices 703, 706, etc. A further photolithographic process patterns and etches down to the back metal contact layer 123 associated with each device so that a contact pad 702, 705 extends peripherally beyond the edges of the devices 703, 706 to form a contact pad or area to allow a wire bond or other electrical interconnect to be made to the bottom or first terminal of device 703, 706 respectively.

A top contact layer 704 and 707 (such as metal bond pad) is formed on the top of the active layers of devices 703 and 706 respectively, to allow a wire bond or other electrical interconnect to be made to the top, or second terminal, of device, 703 and 706.

In summary, in some implementations, the present invention is comprised of the following sequence of steps: (1) attaching inverted (i.e., high band gap cells grown first), metalized, photovoltaic cell wafers onto a rigid carrier (semi-insulating Ge or Si, for example, or thermally conductive carriers if needed, such as AlN), metalized face down, with a permanent adhesive; (2) thinning the wafers; (3) processing the devices, (4) separating the individual devices by mesa etching, during which a backcontact is also made; (5) etching through the backmetal to completely separate the devices; (6) interconnecting the individual devices by thin film conductors; and (7) optionally thinning the carrier by grinding, lapping and/or etching (if need be, to reduce weight).

The front (device) side should be protected during the thinning step. Etchants can be prevented from getting to the front side, either with protective coatings, or by meniscus etching, where etchants do not come into contact with the front side. The final thickness of the carrier wafer may be chosen for the optimum combination of strength, rigidity, low weight, and thermal conductance. The adhesive can also be chosen to have good thermal conductivity, if required, for example for solar cells used in terrestrial concentrator photovoltaic applications. Another adhesive or bond can be an eutectic bond between gold on the device wafer and the Si or Ge carrier wafer, in which case the backmetal would also serve as part of the bond. The backcontact metal can be accessed as before, by etching down to the metal, from the front side. This can be used for wafer-level testing of the devices, even if the bonding adhesive used is non-conductive. The front side backcontact (i.e., the backcontact as accessed from the front side of the wafer) can be also used to interconnect the cells together, by connecting the backcontact of one cell to the front contact of the next, and so on, in different string combinations (series and parallel connections may be defined for different voltage and current specifications for the wafer as a whole).

The interconnection of individual solar cells according to the present invention can be done by welding, soldering or wire bonding, and since such interconnections will be done on one wafer at a time, the set-up costs are much less than if individual discrete cells are to be aligned and die-bonded onto a platform and then interconnected.

The packing density of cells on the wafer according to the present invention can be potentially higher than if individual cells were bonded close together, as on the wafer the separation between cells is defined lithographically, and not by physical/visual alignment as in the individual die case. After either of the above steps, the wafer can be cut into shapes that would allow close packing onto a receiver board, for example for a concentrator system where the whole board gets uniform concentrated light from a mirror or lens.

Bypass diodes, for cell protection, if needed, can also be processed on the wafer in the same way. The extra bypass diode layers have to be grown first (below the top cell), and etched off selectively at the start of the device processing, after the device wafer is thinned. The bypass diode will be grounded to the backside contact of each cell in the array.

It will be understood that each of the elements described above, or two or more together, also may find a useful application in other types of constructions differing from the types of constructions described above.

Although the preferred embodiment of the present invention utilizes a vertical stack of three subcells, the present invention can apply to stacks with fewer or greater number of subcells, i.e. two junction cells, four junction cells, five junction cells, etc. In the case of four or more junction cells, the use of more than one metamorphic grading interlayer may also be utilized.

In addition, although the present embodiment is configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the present invention may utilize an-arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n-type InGaP is one example of a homojunction subcell. Alternatively, as more particularly described in U.S. patent application Ser. No. 12/023,772 filed Jan. 31, 2008, the present invention may utilize one or more, or all, heterojunction cells or subcells, i.e., a cell or subcell in which the p-n junction is formed between a p-type semiconductor and an n-type semiconductor having different chemical compositions of the semiconductor material in the n-type regions, and/or different band gap energies in the p-type regions, in addition to utilizing different dopant species and type in the p-type and n-type regions that form the p-n junction.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the invention has been illustrated and described as embodied in an inverted metamorphic multijunction solar cell, it is not intended to be limited to the details shown, since various modifications and structural changes may be made without departing in any way from the spirit of the present invention.

Without further analysis, from the foregoing, others can, by applying current knowledge, readily adapt the present invention for various applications. Such adaptations should and are intended to be comprehended within the meaning and range of equivalence of the following claims.

What is claimed is:

1. A multijunction solar cell array comprising a plurality of solar cells mounted on a carrier, each solar cell comprising:
   a top contact;
   an upper first solar subcell having a first band gap disposed over the top contact, wherein the first band gap is in the range of 1.8 to 2.1 eV;
   a middle second solar subcell disposed over the upper first solar subcell having a second band gap smaller than the first band gap;
   a graded interlayer composed of InGaAlAs disposed over the middle second solar subcell having a third band gap greater than the second band gap;
   a lower third solar subcell disposed over the graded interlayer having a fourth band gap smaller than the second band gap such that the lower third solar subcell is lattice mismatched with respect to the middle second solar subcell;
   a bottom metal contact layer disposed over the lower third solar subcell; and
   a bond layer disposed over the bottom metal contact layer that mounts the solar cell to the carrier;
   wherein the graded interlayer is compositionally graded to lattice match the middle second solar subcell on one side and the lower third solar subcell on the other side; and
   wherein each pair of solar cells is electrically interconnected by a discrete conductor from the top contact of one solar cell to the bottom contact of the other solar cell for each pair of solar cells.

2. The array as defined in claim 1, wherein the bond layer is an adhesive layer.

3. The array as defined in claim 1, wherein the carrier is selected from the group of consisting of Ge, GaAs, and silicon.

4. The array as defined in claim 1, wherein the carrier is electrically insulating and the solar cell structure is eutectically bonded to the carrier.

5. The array as defined in claim 1, wherein the discrete conductor is selected from the group consisting of wire bonds and film traces.

6. The array as defined in claim 1, wherein the solar cell structure further comprises layers forming a bypass diode.

7. The array as defined in claim 6, wherein said plurality of discrete solar cells and said bypass diode are connected in parallel by welds, solder, or wire bonds.

8. The array as defined in claim 1, wherein the upper first solar subcell is composed of InGa(Al)P.

9. The array as defined in claim 1, wherein the middle second solar subcell is composed of a GaAs, GaInP, GaInAs, GaAsSb, or GaInAsN emitter region and a GaAs, GaInAs, GaAsSb, or GaInAsN base region.

10. The array as defined in claim 1, wherein the middle second solar subcell has a band gap in the range of 1.2 to 1.8 eV.

11. The array as defined in claim 1, wherein the lower third solar subcell is composed of an InGaAs base and emitter layer, or a InGaAs base layer and a InGaP emitter layer.

12. The array as defined in claim 1, wherein the lower third solar subcell has a band gap in the range of 0.7 to 1.2 eV.

13. The array as defined in claim 1, wherein the graded interlayer has approximately a 1.5 eV band gap throughout its thickness.

14. The array as defined in claim 1, wherein the graded interlayer is composed of nine or more steps of layers of semiconductor material with monotonically changing lattice constant and constant band gap.

15. A multijunction solar cell array comprising a plurality of solar cells mounted on a carrier prepared by a method comprising:
   providing a first semiconductor substrate;
   depositing on the first semiconductor substrate a sequence of layers of semiconductor material forming a solar cell;
   depositing a sequence of layers of semiconductor material forming a bypass diode on the first semiconductor substrate;
   mounting a carrier on top of the sequence of layers;

forming a plurality of discrete solar cells from the sequence of layers; and electrically interconnecting the solar cells.

16. A multijunction solar cell array comprising a plurality of solar cells mounted on a carrier prepared by a method comprising:

providing a first semiconductor substrate;

depositing on said first semiconductor substrate a sequence of layers of semiconductor material forming a solar cell;

mounting a carrier on top of the sequence of layers;

forming a plurality of discrete solar cells from said sequence of layers; and electrically interconnecting said solar cells, wherein the interconnecting step includes depositing a conductive layer between the discrete solar cells; and wherein depositing said sequence of layers comprises:

forming an upper first solar subcell on said first substrate having a first band gap;

forming a middle second solar subcell over said upper first solar subcell having a second band gap smaller than said first band gap;

forming a graded interlayer having a third band gap greater than said second band gap over said middle second solar subcell; and forming a lower third solar subcell over said graded interlayer having a fourth band gap smaller than said second band gap such that said lower third solar subcell is lattice mismatched with respect to said middle second solar subcell, wherein the fourth band gap is in the range of 0.7 to 1.2 eV.

17. The array as defined in claim 16, wherein the graded interlayer is composed of InGaAlAs.

18. The array as defined in claim 16, wherein the graded interlayer has approximately a 1.5 eV band gap throughout its thickness.

19. The array as defined in claim 16, wherein the graded interlayer is composed of any of the As, N, Sb based III-V compound semiconductors subject to the constraints of having the in-plane lattice parameter greater or equal to that of said middle second solar subcell and less than or equal to that of said lower third solar subcell, and having a band gap energy greater than that of said middle second solar subcell.

* * * * *